US006426894B1

United States Patent
Hirano

(10) Patent No.: US 6,426,894 B1
(45) Date of Patent: Jul. 30, 2002

(54) METHOD AND CIRCUIT FOR WRITING DATA TO A NON-VOLATILE SEMICONDUCTOR MEMORY DEVICE

(75) Inventor: Yasuaki Hirano, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/703,193

(22) Filed: Oct. 31, 2000

(30) Foreign Application Priority Data

Jan. 12, 2000 (JP) ........................................ 2000-004091

(51) Int. Cl.⁷ .............................................. G11C 11/34
(52) U.S. Cl. .............................. 365/185.18; 365/185.27
(58) Field of Search ......................... 365/185.18, 185.27

(56) References Cited

U.S. PATENT DOCUMENTS

| | | | |
|---|---|---|---|
| 4,698,787 A | 10/1987 | Mukherjee et al. | ......... 365/185 |
| 5,946,234 A | * 8/1999 | Chen et al. | ............... 365/185.8 |
| 6,157,058 A | * 12/2000 | Ogura | ......................... 257/315 |

FOREIGN PATENT DOCUMENTS

JP 6-82841 10/1994

* cited by examiner

Primary Examiner—M. Tran
(74) Attorney, Agent, or Firm—Morrison & Foerster LLP

(57) ABSTRACT

The present invention provides a method for writing data to a non-volatile semiconductor memory device including a plurality of memory cells which are arranged in a matrix in which data can be electrically written to or erased from the memory cells, the plurality of memory cells being grouped into one or more blocks, the memory cells in each block being provided on a same semiconductor base, each of the memory cells having a field effect transistor including a drain, a source, a floating gate and a control gate, the sources of the memory cells in each block being electrically connected to each other. The method performs a write operation to at least one of the plurality of memory cells in which the method includes the steps of: applying a first voltage to the control gate; applying a second voltage to the drain; applying a third voltage to the source; and applying a fourth voltage to the semiconductor base, the fourth voltage having a zero or positive value which is lower than the third voltage, wherein the first voltage, the second voltage, the third voltage and the fourth voltage are different from one other.

11 Claims, 11 Drawing Sheets

METHOD AND CIRCUIT FOR WRITING DATA TO A NON-VOLATILE SEMICONDUCTOR MEMORY DEVICE

BACKGROUND OF THE INVENTION

1. Field of the Invention

The present invention relates to a method and a circuit for writing data to a non-volatile semiconductor memory device. More particularly, the present invention relates to a method and a circuit for writing data to a non-volatile semiconductor memory device based on a write operation using secondary electrons.

2. Description of the Related Art

An ETOX (registered trademark of Intel; EPROM Thin Oxide) type non-volatile semiconductor memory device is the most widely used conventional non-volatile semiconductor memory device (a flash memory). Japanese Patent Publication for Opposition No. 6-82841 (Conventional Example 1) discloses a non-volatile semiconductor memory device of this type. Referring to FIG. 1, the structure of a cell of an ETOX type non-volatile semiconductor memory device will be described. The non-volatile semiconductor memory device cell includes a source 14a and a drain 14b which are formed on a substrate 10, with a channel layer 14c extending therebetween. A floating gate 16 is provided over the channel layer 14c via a tunnel oxide film 15. Moreover, a control gate 18 is provided over the floating gate 16 via an interlayer insulating film 17.

The principle of operation of an ETOX type non-volatile semiconductor memory device will now be described. Table 1 shows voltages to be applied respectively to the control gate 18, the source 14a, the drain 14b and the substrate 10 in a write mode, an erase mode, and a read mode.

TABLE 1

|  | Control gate | Drain | Source | Substrate |
| --- | --- | --- | --- | --- |
| Write | 10 V | 6 V/0 V | 0 V | 0 V |
| Erase | −9 V | Open | 6 V | 0 V |
| Read | 3 V | 1 V | 0 V | 0 V |

In the write (programming) mode, a voltage of 10 V, for example, is applied to the control gate 18 of the memory cell to which data is to be written, a reference voltage of 0 V, for example, is applied to the source 14a thereof, and a voltage of 6 V, for example, is applied to the drain 14b. Then, a current of 500 µA/cell flows through the channel layer 14c, thereby generating channel hot electrons (hereinafter, referred to as "CHEs") in a portion of the drain 14b side of the memory cell where there is a high electric field. Basically, CHEs are high-energy electrons which are generated by a high electric field and which flow through the channel. When CHEs jump over the energy barrier of the tunnel oxide film so as to be injected into the floating gate 16, the threshold voltage of the memory cell increases. The drain of each memory cell to which no data is to be written is set to the reference voltage (e.g., 0 V). The memory cell to which data has been written as described above has a threshold voltage equal to or greater than 3.5 V as shown in FIG. 2 by the curve labelled "Programmed state (a)".

In the erase mode, a voltage of −9 V, for example, is applied to the control gate 18 and a voltage of 6 V, for example, is applied to the source 14a, whereby electrons are withdrawn from the floating gate 16 on the source 14a side of the memory cell, thereby reducing the threshold voltage.

In such a case, the memory cell has a threshold voltage as shown in FIG. 2 by the curve labelled "Erased state (b)". Thus, the threshold voltage of the memory cell whose data has been erased is less than or equal to 2.0 V.

For a memory cell to/from which data has been written/ erased, a read operation can be performed by applying a voltage of 3 V to the control gate 18 and a voltage of 1 V to the drain 14b, while controlling the potential of the source 14a to be 0 V. Under such voltage conditions, if data stored in the memory cell is in the programmed state, the threshold voltage of the memory cell is equal to or greater than 3.5 V. Therefore, no current flows through the memory cell, whereby the data in the memory cell is determined to be "0". If data stored in the memory cell is in the erased state, the threshold voltage of the memory cell is less than or equal to 2.0 V, and a current flows through the memory cell, whereby the data in the memory cell is determined to be "1".

The write operation will now be described in greater detail with reference to FIG. 3. FIG. 3 illustrates the structure of a write circuit of Conventional Example 1.

The write circuit includes a memory cell array 300 including a plurality of memory cells N (M00, M01, ..., M12) which are arranged in a matrix. Data can be electrically written to or erased from each of the memory cells M. The memory cells M are grouped into one or more blocks. In the example illustrated in FIG. 3, one block includes six memory cells. Each of the memory cells M00, M01, ..., M12 in the memory cell array 300 has a field effect transistor including the floating gate 16 and the control gate 18. The sources 14a of the memory cells M in each block are coupled to a common source line 14A so that they are electrically connected to each other.

The write circuit of FIG. 3 further includes a row decoder 320 for supplying a voltage signal to the control gate 18 of each of the memory cells M via a word line WL, a program voltage application circuit 340 for applying a voltage signal to the drain 14b of the memory cell M via a bit line BL, a source voltage application circuit 360 for applying a voltage signal to the common source line 14A, and a high voltage charge pump 380 for supplying a voltage to these circuits (320, 340 and 360).

An exemplary write operation will now be described while describing the details of the write circuit of FIG. 3. Consider a case where data "0" (write enabled) and data "1" (write prohibited) are written to the memory cells M00 and M10, respectively, which are connected to the word line WL0, while no data is written to the memory cells M01, M11 and M02, M12, which are connected to the respective word lines WL1 and WL2.

When the write operation is initiated, the high voltage charge pump 380 increases a supply voltage V0 from a voltage source (not shown) so as to output a voltage V1 of 10 V, for example. The voltage V1 is decoded by the row decoder 320 into a voltage Vp of 10 V, for example, and output to the word line WL0. Whereas another voltage Vs of 0 V, for example, is output from the row decoder 320 to the word lines WL1 and WL2. Each of these voltages are applied to the control gate 18 of the memory cell M which is connected to the respective word line WL, thereby controlling whether or not to perform a write operation to the memory cell M.

The operation of applying a voltage to the drain 14b of the memory cell M via the bit line BL will be described. The voltage V1 from the high voltage charge pump 380 is regulated by a regulator circuit 1 to provide a stable voltage V1a (e.g., 6 V). Whether or not the voltage V1a is to be applied to each bit line BL is controlled by the MOS transistors (Tr01 and Tr02 or Tr11 and Tr12) which is connected to the bit line BL. The MOS transistors Tr01 and Tr11 are controlled by data which is externally provided via a node 1 and a node 2, respectively. Whereas the MOS transistors Tr02 and Tr12 together form a column switch 344 and are commonly controlled by an externally provided control signal Vc.

At the initiation of a write operation, a node 0 is brought to a "high" level (e.g., the level of the voltage V0) and the node 1 is brought to a "low" level (e.g., the reference voltage of 0 V) by the externally provided data. The "high" level at the node 0 is latched by a latch circuit 342a and then level-converted by a level shift circuit HV0 into a "high" level which corresponds to the level of the voltage Vp at a node H0. Thus, the MOS transistor Tr01 is turned ON. On the other hand, the "low" level at the node 1 is latched by a latch circuit 342b and then level-converted by a level shift circuit HV1 whose output is still at the "low" level (0 V). Thus, the MOS transistor Tr11 is OFF.

The externally provided control signal Vc at the "high" level (the level of the voltage V0) is provided to the column switch 344 which is provided in a subsequent stage following the MOS transistors Tr01 and Tr11. The control signal Vc is level-converted by a level shift circuit HV7 into the "high" level which corresponds to the level of the voltage Vp. This signal is input to all of the MOS transistors in the column switch 344, whereby the MOS transistors Tr02 and Tr12 are both turned ON.

Since the MOS transistors Tr01 and Tr02 are ON, the voltage V1a (e.g., 6 V) is applied to the memory cell M00 via the bit line BL0. On the other hand, the MOS transistor Tr11 is OFF, and thus the bit line BL1 is floating, whereby there is no voltage application to the memory cell M10.

The voltage application to the source 14a of the memory cell M is performed by the source voltage application circuit 360 as described above. The sources 14a of the memory cells M in one block are connected to the common source line 14A, and the voltage application to the common source line 14A is controlled by a MOS transistor Tr8. The MOS transistor Tr8 is turned ON by an externally provided control signal Vd at a "low" level, and the common source line 14A is brought to a level of the reference voltage Vs of 0 V, for example. A regulator circuit 2 is provided for applying a voltage Ve (e.g., 6 V) to the common source line 14A in an erase operation, and is irrelevant to the write operation. Thus, the regulator circuit 2 will not be further described below.

As described above, by applying the respective voltages for a write operation as shown in Table 1 to the memory cell M00, electrons are injected into the floating gate 16, whereby the threshold voltage of the memory cell M increases to be equal to or greater than 3.5 V. On the other hand, the memory cell M10, to which the voltage V1a is not applied, maintains its initial state where the threshold voltage is less than or equal to 2.0 V. Typically, a write operation involves a write operation for writing data to a memory cell and a verify operation for verifying the threshold voltage of the memory cell which has been changed by the write operation. The write and verify operations are performed alternately to each other so that the threshold voltage of the memory cell is controlled to be a predetermined value by verifying the threshold voltage.

Such a write operation has the following problems. Since the write operation is performed by generating CHEs, the amount of current consumed by the drain in a write operation for one memory cell is as large as 500 $\mu$A. While the number of bits (the number of memory cells) to be written in parallel is two in the example described above, it is 16 or more for some commercially available LSIs (large scale integrated circuits). In such a case, the total amount of current to be consumed is as large as 8 mA, and thus the scale of the booster charge pump becomes very large. Recently, as portable terminal devices such as portable phones have become widespread, there have been attempts to reduce the supply voltage in order to reduce the current consumption. When the supply voltage is reduced, the area of the above-described charge pump circuit increases. For example, when the supply voltage is changed from 2.4 V to 1.8 V, the layout area of the charge pump circuit increases by a factor of about 4. Due to such circumstances, it is necessary to reduce the current consumption in the write operation in order to efficiently operate the non-volatile semiconductor memory device.

One solution to the above-described problem is a write method using secondary electrons. This method is disclosed in the Technical Digest of IEDM, p.279–282, 1997 ("Secondary Electron Flash—a High Performance Low Power Flash Technology for 0.35 $\mu$m and below"; Conventional Example 2). This write method will be described with reference to FIG. 4.

FIG. 4 is a cross-sectional view schematically illustrating the structure of a memory cell used in this write method. As compared to the memory cell shown in FIG. 1, the memory cell shown in FIG. 4 further includes an n-well (n$^-$ type) 11 and a p-well (p$^-$ type) 12. The source/drain regions (n$^+$ type) 14a, 14b are formed on the p-well 12. The voltage V0 is applied to the n-well 11, and the p-well 12 and p-substrate 10 are electrically isolated from each other by the n-well 11. The structure as shown in FIG. 4 will be hereinafter referred to as a "triple-well structure". Elements in FIG. 4 that are functionally similar to those shown in FIG. 1 are provided with like reference numerals.

The write operation of a non-volatile semiconductor memory device having the memory cell of FIG. 4 is as follows. In the write operation, voltages of 5 V, 3.5 V and –3 V are applied to the control gate 18, the drain 14b and the p-well 12, respectively. Thus, as shown in FIG. 4, a current (electrons) flows through the channel layer 14c, thereby generating electron-hole pairs through impact ionization in the vicinity of the drain 14b. The holes of the electron-hole pairs are accelerated and move toward the substrate 10. The holes generate further electron-hole pairs as they move across the depletion layer between the drain 14b (n$^+$) and the p-well 12 (p$^-$). Among the electron-hole pairs, those electrons having a high level of energy (referred to as "hot electrons" or "secondary electrons") are injected into the floating gate 16, thereby increasing the threshold voltage to be equal to or greater than 3.5 V.

According to Conventional Example 2 which employs this method, the write time is 7 $\mu$s and the current consumption is less than or equal to 10 $\mu$A. Thus, the current consumption is reduced to be 1/50 of the current consumption of the conventional example of FIG. 1, i.e., 500 $\mu$A, thereby providing an improvement to the conventional example of FIG. 1.

The operations in the erase mode and the read mode are the same as those described above for Conventional Example 1. The applied voltages are summarized in Table 2.

TABLE 2

|  | Control gate | Drain | Source | P-well |
|---|---|---|---|---|
| Write | 5 V | 3.5 V/0 V | 0 V | −3 V |
| Erase | −9 V | Open | 6 V | 0 V |
| Read | 3 V | 1 V | 0 V | 0 V |

The above-described write method according to Conventional Example 2 will now be described in greater detail with reference to FIG. 5. FIG. 5 illustrates the structure of a write circuit of a non-volatile semiconductor memory device having the memory cell of FIG. 4. As can be seen from a comparison to the write circuit (FIG. 3) using CHEs, the write circuit of FIG. 5 further includes a circuit (substrate bias control circuit 500) for controlling a backgate bias of the memory cell. Other than the substrate bias control circuit 500, the elements shown in FIG. 5 are similar, and thus denoted by like reference numerals, to those shown in FIG. 3.

For example, the substrate bias control circuit 500 is primarily composed of a negative voltage charge pump 610 and a convergence circuit 620, as shown in FIG. 6. The substrate bias control circuit 500 further includes a clock generation circuit 630 for controlling the output of the negative voltage charge pump 610, and a negative voltage level shifter NV and a MOS transistor 640 for controlling the output of the substrate bias control circuit 500. The negative voltage charge pump 610 includes P-channel MOS transistors, capacitors and inverter circuits, as shown in FIG. 6. The negative voltage level shifter NV has a structure as shown in FIG. 7.

The write operation by the write circuit of FIG. 5 having the substrate bias control circuit 500 will now be described. The write operation is basically the same as that of Conventional Example 1 described above except that a negative voltage is applied to the p-well 12 and that different voltage values are used. Again, consider a case where data "0" (write enabled) and data "1" (write prohibited) are written to the memory cells M00 and M10, respectively, which are connected to the word line WL0, while no data is written to the memory cells M01, M11 and M02, M12, which are connected to the respective word lines WL1 and WL2.

When the write operation is initiated, a control signal Vb transitions to the "high" level (the level of the voltage V0). In response to this, the clock generation circuit 630 starts its operation so as to output 2-phase clocks clk and clk bar, for example. Thus, the operation of the negative voltage charge pump 610 is initiated so as to output a negative voltage as the output of the negative voltage charge pump 610. A voltage detection is performed by resistance division using a voltage Vc and a negative voltage, and when the negative voltage value becomes greater than a Ref voltage value, a reset signal Vr is input to the clock generation circuit 630 from the convergence circuit 620. In response to the reset signal Vr input thereto, the clock generation circuit 630 stops clocking, thereby terminating the operation of the negative voltage charge pump 610. Thus, the negative voltage charge pump 610 is repeatedly switched between an operating state and a non-operating state by the reset signal Vr, whereby the negative voltage takes a value of about −3 V as necessary.

The negative voltage level shifter NV converts the signal level of a control signal Vb. In particular, an input at the "high" level (the level of the voltage V0) is converted to a negative voltage (e.g., −3 V), and an input at the "low" level (the level of the reference voltage Vs) is converted to the level of the voltage V0. Thus, during a write operation (when the control signal Vb is at the "high" level), the MOS transistor 640 is turned OFF, whereby an output voltage Vf, which is a negative voltage (−3 V), is output to the output terminal t of the substrate bias control circuit 500. The output voltage Vf is applied to the p-well 12 of the memory cell as a backgate bias of the memory cell.

On the other hand, the charge pump 380 increases the supply voltage V0 from the voltage source (not shown) so as to output the voltage V1 of 5 V, for example. The voltage V1 is decoded by the row decoder 320 into the voltage Vp of 10 V, for example, and output to the word line WL0. Whereas, the voltage Vs of 0 V, for example, is output from the row decoder 320 to the non-selected word lines WL1 and WL2. Each of these voltages are applied to the control gate 18 of the memory cell M which is connected to the respective word line WL, thereby controlling whether or not to perform a write operation to the memory cell M.

The operation of applying a voltage to the drain 14b of the memory cell M via the bit line BL will be described. The voltage V1 from the high voltage charge pump 380 is regulated by the regulator circuit 1 to provide a stable voltage V1a (e.g., 3.5 V). Whether or not the voltage V1a is to be applied to each bit line BL is controlled by the MOS transistors (Tr01 and Tr02 or Tr11 and Tr12) which is connected to the bit line BL. The MOS transistors Tr01 and Tr11 are controlled by data which is externally provided via the node 0 and the node 1, respectively. Whereas the MOS transistors Tr02 and Tr12 together form the column switch 344 and are commonly controlled by the externally provided control signal Vc.

At the initiation of a write operation, data is transferred to the node 0 and the node 1, whereby the node 0 and the node 1 are brought to the "high" level and the "low" level, respectively. The "high" level at the node 0 is latched by the latch circuit 342a and then level-converted by the level shift circuit HV0 into the "high" level which corresponds to the level of the voltage Vp at the node H0. Thus, the MOS transistor Tr01 is turned ON. On the other hand, the "low" level at the node 1 is latched by the latch circuit 342b and then level-converted by the level shift circuit HV1 whose output is still at the "low" level (0 V). Thus, the MOS transistor Tr11 is OFF.

The externally provided control signal Vc at the "high" level is provided to the column switch 344 which is provided in a subsequent stage following the MOS transistors Tr01 and Tr11. The control signal Vc is level-converted by the level shift circuit HV7 into the "high" level which corresponds to the level of the voltage Vp. This signal is input to all of the MOS transistors in the column switch 344, whereby the MOS transistors Tr02 and Tr12 are both turned ON. Each of the level shift circuits HV have a structure as shown in FIG. 8.

Since the MOS transistors Tr01 and Tr02 are ON, the voltage V1a (3.5 V) is applied to the memory cell M00 via the bit line BL0. On the other hand, the MOS transistor Tr11 is OFF, and thus the bit line BL1 is floating, whereby there is no voltage application to the memory cell M10.

The common source line 14A for the memory cells M is at the reference voltage Vs of 0 V, for example, as described above with reference to FIG. 3.

As described above, by applying the respective voltages for a write operation as shown in Table 2 to the memory cell M00, electrons are injected into the floating gate 16, whereby the threshold voltage of the memory cell M increases to be equal to or greater than 3.5 V. On the other hand, the memory cell M10, to which the voltage V1a is not applied, maintains its initial state where the threshold voltage is less than or equal to 2.0 V.

In a program verify operation for verifying the threshold voltage of a memory cell after data has been written thereto, first, the voltage Vb input to the negative voltage level shifter NV becomes "low", whereby a voltage which has been reduced to the reference voltage Vs through a discharge is output from the negative voltage level shifter NV as the output voltage Vf. Then, the potential of the word line WL0 is brought to 3.5 V to perform a read operation as a verify operation. When it is determined that the threshold voltage of the memory cell M00 is equal to or greater than 3.5 V, the write operation is completed. When the threshold voltage of the memory cell M00 is less than 3.5 V, a write operation is repeated by again applying a write signal. Thus, the write and verify operations are performed alternately to each other so that the threshold voltage of the memory cell is controlled to be a predetermined value (equal to or greater than 3.5 V) by verifying the threshold voltage.

However, Conventional Example 2 employing the write operation using secondary electrons has the following problems: (1) in a write operation, it is necessary to control the potential of the p-well 12 to be a negative value, and it takes a long time to charge the p-well 12 so that the potential thereof is negative, thereby increasing the write time; and (2) since the p-well 12 is charged to a negative potential, a negative voltage charge pump circuit is required which increases the layout area of the device.

The first problem (1) is further discussed below. For example, a 16 M non-volatile semiconductor memory device has a p-well whose capacitance is about 10000 pf. Therefore, when the p-well is to be charged to −3 V by using a negative voltage charge pump whose charging capability is 1 mA, the amount of time t required for charging the p-well to −3 V is obtained as follows:

$t = 10000 pf \times 3V / 1 \text{ mA} = 30 \mu s$

As can be seen from this calculation, at least 30 $\mu s$ is required for charging the p-well to −3 V. Since the p-well is of a p⁻ type and thus has a high resistance, it actually requires more than 30 $\mu s$ until the voltage in the central portion of the well is completely stabilized. Moreover, the verify operation is performed by discharging the p-well, which takes about 10 $\mu s$. Thus, the amount of time required for the entire write operation is 40 $\mu s$, which only accounts for the amount of time required for charging and discharging the p-well. The amount of time which is actually required for a write operation is about 13 $\mu s$ excluding the amount of time for charging and discharging the p-well. The particulars of the time period are as follows: pulse application time: 7 $\mu s$, word line set-up time: 100 ns, bit line set-up time: 100 ns, charge pump start-up time: 2 $\mu s$, discharge time for the charge pump voltage, etc.: 1 $\mu s$, verify time: 2 $\mu s$, and circuit overhead: 1 $\mu s$. The word line set-up time can be ignored in the calculation because the word line set-up time can overlap the charge pump set-up time. Therefore, the total amount of time required for the entire write operation is about 13 $\mu s$ (7 $\mu s$+2 $\mu s$+1 $\mu s$+2 $\mu s$+1 $\mu s$+100 ns). As can be seen, the well voltage set-up time is much longer than these amounts of time, thereby increasing the write time and preventing one from achieving a high-speed write operation.

The second problem (2) is discussed below. A negative voltage charge pump needs to have a charging capability of about 1 mA in view of the well capacitance, as described above. However, the efficiency of a negative voltage charge pump is typically as low as about 10%. Therefore, the layout area for the negative voltage charge pump is increased (e.g., about 1% of the chip area), thereby increasing the chip area of the device.

SUMMARY OF THE INVENTION

According to one aspect of this invention, there is provided a method for writing data to a non-volatile semiconductor memory device including a plurality of memory cells which are arranged in a matrix in which data can be electrically written to or erased from the memory cells, the plurality of memory cells being grouped into one or more blocks, the memory cells in each block being provided on a same semiconductor base, each of the memory cells having a field effect transistor including a drain, a source, a floating gate and a control gate, the sources of the memory cells in each block being electrically connected to each other. The method performs a write operation to at least one of the plurality of memory cells in which the method includes the steps of: applying a first voltage to the control gate; applying a second voltage to the drain; applying a third voltage to the source; and applying a fourth voltage to the semiconductor base, the fourth voltage having a zero or positive value which is lower than the third voltage, wherein the first voltage, the second voltage, the third voltage and the fourth voltage are different from one other.

In one embodiment of the invention, the write operation is performed by secondary electrons being generated on the drain side of the non-volatile semiconductor memory device and injected into the floating gate. The first voltage, the second voltage and the third voltage are positive voltages. The first voltage is higher than the second voltage. The second voltage is higher than the third voltage.

In one embodiment of the invention, the third voltage is equal to a supply voltage output from a voltage source provided for supplying a voltage to the memory cells.

In one embodiment of the invention, the third voltage is higher than a supply voltage output from a voltage source provided for supplying a voltage to the memory cells.

In one embodiment of the invention, the third voltage is obtained by generating a fifth voltage higher than the supply voltage from the voltage source by using a charge pump circuit and by regulating the fifth voltage so as to decrease a level of the fifth voltage.

According to another aspect of this invention, there is provided a circuit for writing data to a non-volatile semiconductor memory device including a plurality of memory cells which are arranged in a matrix in which data can be electrically written to or erased from the memory cells, the plurality of memory cells being grouped into one or more blocks, the memory cells in each block being provided on a same semiconductor base, each of the memory cells having a field effect transistor including a drain, a source, a floating gate and a control gate, the sources of the memory cells in each block being electrically connected to each other. A voltage path is provided between the source and the semiconductor base, the voltage path including an element capable of causing a voltage drop.

In one embodiment of the invention, a plurality of the voltage paths are provided in parallel, the number of the voltage paths being equal to the number of columns of the memory cells matrix.

In one embodiment of the invention, the element capable of causing a voltage drop is a resistive element.

In one embodiment of the invention, the voltage path is in an ON state only during a write operation, and a voltage is supplied to the source from an external circuit during a period of time other than the write operation.

In one embodiment of the invention, the circuit further includes a control circuit for ensuring that during a write operation, in each block, a number of columns of the memory cells matrix to which data is simultaneously written and a number of voltage paths which are simultaneously in an ON state.

In one embodiment of the invention, during a write operation, a current which flows through the field effect transistor flows through the voltage path so that a voltage of the commonly connected sources is higher than a potential of the semiconductor base.

Thus, the invention described herein makes possible the advantages of providing a method and a circuit for writing data to a non-volatile semiconductor memory device in which it is possible to realize a high-speed write operation and a small layout area.

These and other advantages of the present invention will become apparent to those skilled in the art upon reading and understanding the following detailed description with reference to the accompanying figures.

DESCRIPTION OF THE PREFERRED EMBODIMENTS

According to the method for writing data to a non-volatile semiconductor memory device of the present invention, a write operation is performed as follows. A zero or positive voltage (a fourth voltage) is applied to a semiconductor base in which a memory cell is provided, and a third voltage which is higher than the fourth voltage is applied to the source of the memory cell. Thus, the present invention ensures a sufficient potential difference between the source and the semiconductor base without charging the semiconductor base to a negative potential. The write time is reduced because it is not necessary to charge the semiconductor base to a negative potential.

In a write circuit of the non-volatile semiconductor memory device of the present invention, there is provided a voltage path between the source and the semiconductor base including an element such as a resistive element which is capable of causing a voltage drop in order to apply a voltage higher than the fourth voltage. Thus, the cell current flows through the resistive element, whereby the potential of the source line can be increased to be higher than the potential of the semiconductor base (the fourth voltage) due to the presence of the resistive element. Alternatively, the potential difference between the source and the semiconductor base can be ensured by supplying a voltage having a desired value (a third voltage) directly to the source line instead of using the resistive element.

Various embodiments of the present invention will now be described.

(Embodiment 1)

A method and a circuit for writing data to a non-volatile semiconductor memory device according to Embodiment 1 of the present invention will be described with reference to FIGS. 9 and 10.

Figure 9:
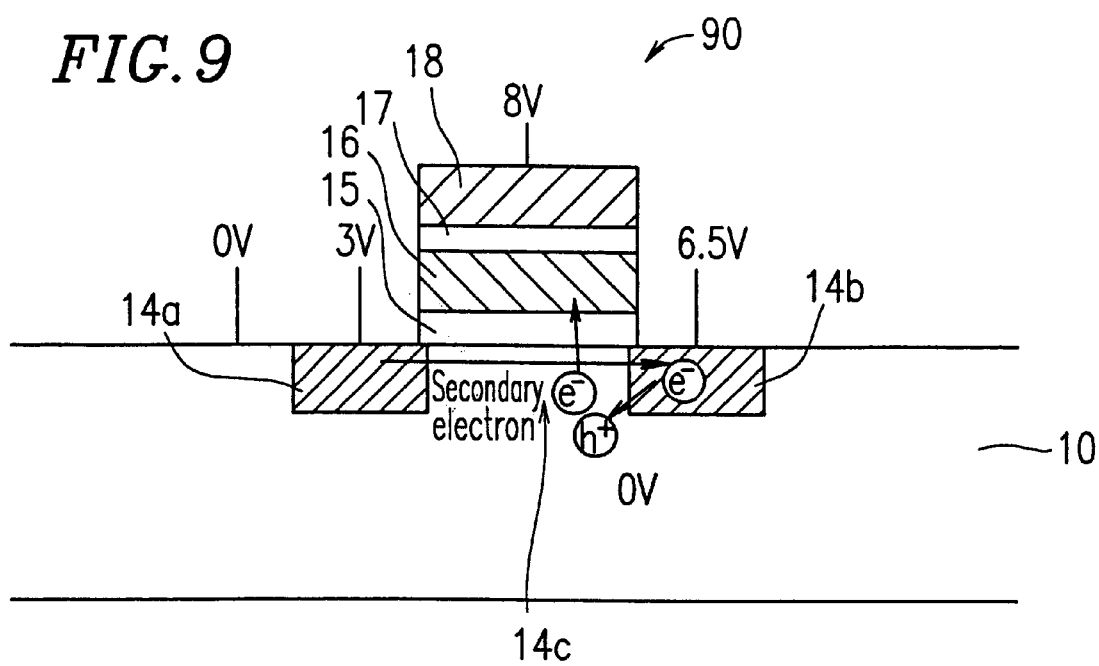
FIG. 9 illustrates the structure of a memory cell of a non-volatile semiconductor memory device according to Embodiment 1 of the present invention and the principle of a write method therefor.

FIG. 9 is a cross-sectional view schematically illustrating the structure of a memory cell 90 of a non-volatile semiconductor memory device used in Embodiment 1. The memory cell 90 is formed by a field effect transistor. More specifically, as shown in FIG. 9, the memory cell 90 includes a source 14a and a drain 14b which are formed on a substrate 10 (semiconductor base), with a channel layer 14c extending therebetween. A floating gate 16 is provided over the channel layer 14c via a tunnel oxide film 15. Moreover, a control gate 18 is provided over the floating gate 16 via an interlayer insulating film 17. A plurality of such memory cells 90 are arranged in a matrix on the substrate and are grouped into one or more blocks. The sources of the memory cells in one block are coupled together so that they are electrically connected to each other.

The principle of operation of the memory cell 90 in each of a write mode, an erase mode and a read mode will be described. Table 3 shows voltages to be applied respectively to the control gate 18, the source 14a, the drain 14b and the substrate 10 in the write mode, the erase mode, and the read mode.

TABLE 3

| | Control gate | Drain | Source | Substrate |
|---|---|---|---|---|
| Write | 8 V | 6.5 V/0 V | 3 V | 0 V |
| Erase | −9 V | Open | 6 V | 0 V |
| Read | 3 V | 1 V | 0 V | 0 V |

Figure 1:
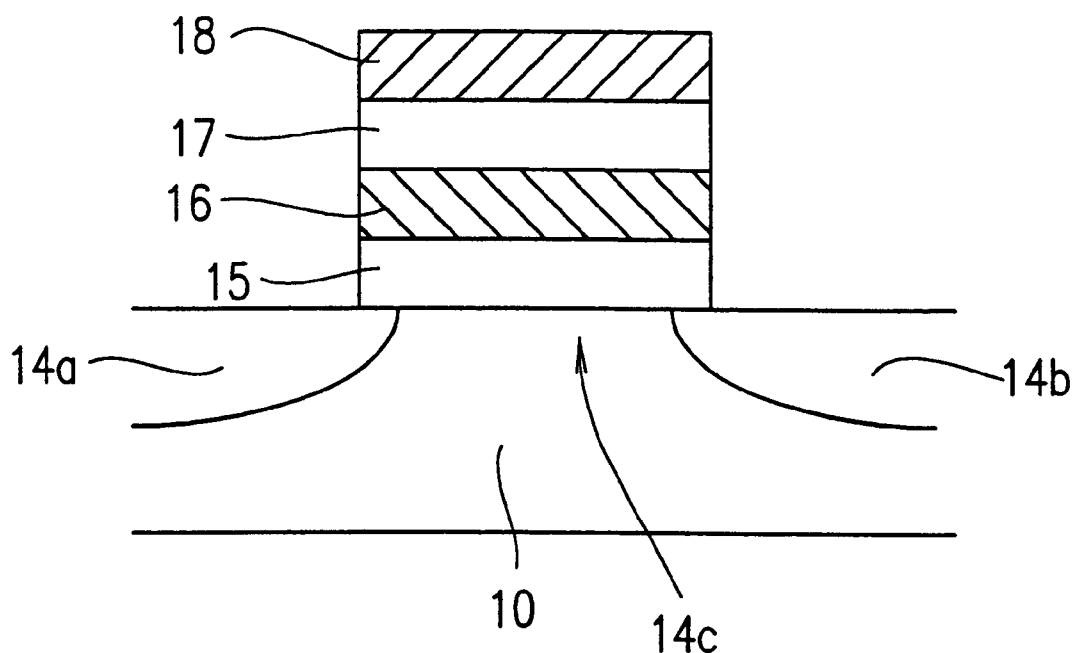
FIG. 1 is a cross-sectional view illustrating the structure of a memory cell in a conventional non-volatile semiconductor memory device.
Figure 2:
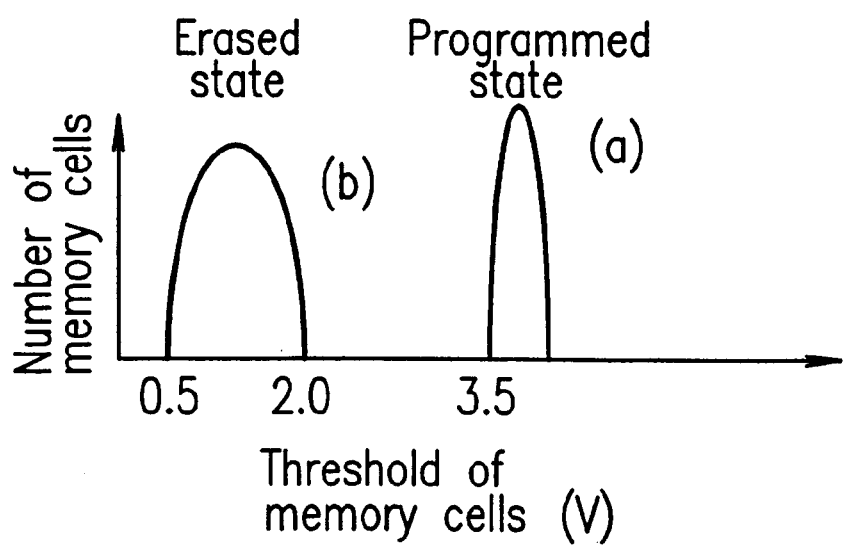
FIG. 2 is a graph illustrating the threshold voltages of a non-volatile semiconductor memory device in a programmed state and in an erased state.
Figure 3:
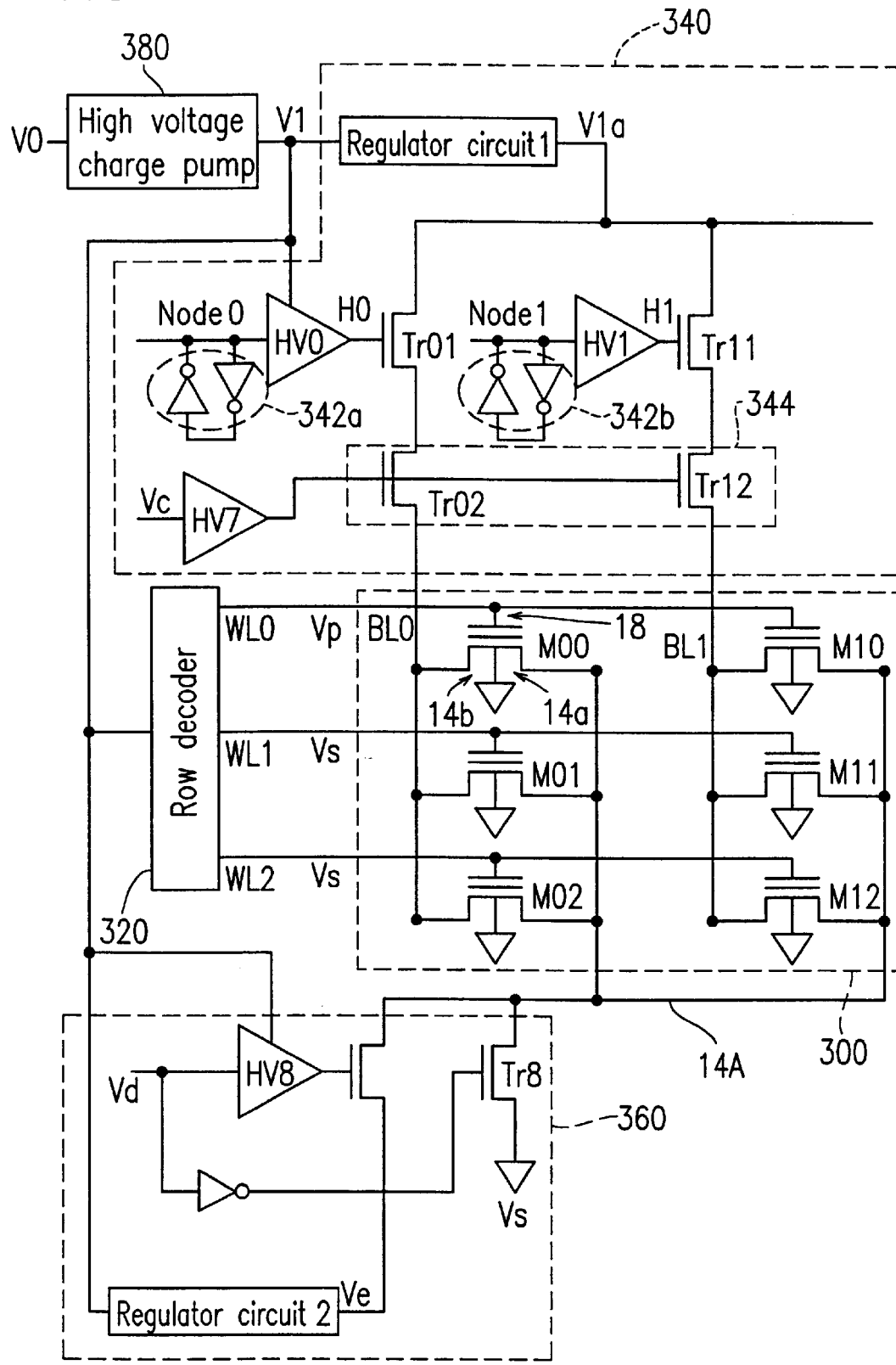
FIG. 3 illustrates the structure of a write circuit of a non-volatile semiconductor memory device of Conventional Example 1.

In the write (programming) mode, a voltage of 8 V, for example, is applied to the control gate 18 of the memory cell to which data is to be written, a voltage of 6.5 V, for example, is applied to the drain 14b thereof, and the substrate 10 is controlled to a reference voltage of 0 V, for example. By such a voltage application, a current flows through the channel layer 14c. As a result, the potentials of the source 14a and a common source line 14A (FIG. 10) are brought to about 3 V (this will later be described in greater detail). The potential of the drain of the memory cell to which data is not written is set to be 0 V. Under such voltage conditions, a current (electrons) flows through the channel layer 14c, thereby generating electron-hole pairs through impact ionization in the vicinity of the drain 14b, as shown in FIG. 9. The holes of the electron-hole pairs are accelerated and move toward the substrate 10. The holes generate further electron-hole pairs as they move across the depletion layer between the drain 14b ($n^+$) and the substrate 10 ($p^-$). Among the electron-hole pairs, those electrons having a high level of energy (referred to as "hot electrons" or "secondary electrons") are injected into the floating gate 16, thereby increasing the threshold voltage to be equal to or greater than 3.5 V. The threshold voltage for the memory array to which data has been written is as shown in FIG. 2 by the curve labelled "Programmed state (a)".

In the erase mode, a voltage of −9 V, for example, is applied to the control gate 18 and a voltage of 6 V, for example, is applied to the source 14a, whereby electrons are withdrawn from the floating gate 16 on the source 14a side, thereby reducing the threshold voltage. In such a case, the memory cell has a threshold voltage as shown in FIG. 2 by the curve labelled "Erased state (b)". Thus, the threshold voltage of the memory cell whose data has been erased is less than or equal to 2.0 V.

For a memory cell on which a write or erase operation has been performed as described above, a read operation can be performed as follows. Voltages of 3 V and 1 V are applied to the control gate 18 and the drain 14b, respectively, and the potential of the source 14a is controlled to be 0 V. Under such voltage conditions, if data stored in the memory cell is in the programmed state, the threshold voltage of the memory cell is equal to or greater than 3.5 V. Therefore, no current flows through the memory cell, whereby the data in the memory cell is determined to be "0". If data stored in the memory cell is in the erased state, the threshold voltage of the memory cell is less than or equal to 2.0 V, and a current flows through the memory cell, whereby the data in the memory cell is determined to be "1". The determination can be made by detecting the current by using a sense circuit (not shown) which is connected to a bit line which is in turn connected to the drain of the memory cell.

The write operation will now be described in greater detail with reference to FIG. 10. FIG. 10 illustrates the structure of the write circuit of the non-volatile semiconductor memory device according to the present embodiment. The write circuit includes a memory cell array 300 including a plurality of memory cells M (M00, M01, ..., M12) which are arranged in a matrix. Data can be electrically written to or erased from each of the memory cells M. The memory cells M are grouped into one or more blocks. In the example illustrated in FIG. 10, one block includes six memory cells. Each of the memory cells M00, M01, ..., M12 in the memory cell array 300 has a field effect transistor including the floating gate 16 and the control gate 18. The sources 14a of the memory cells M in each block are coupled to the common source line 14A so that they are electrically connected to each other.

Figure 10:
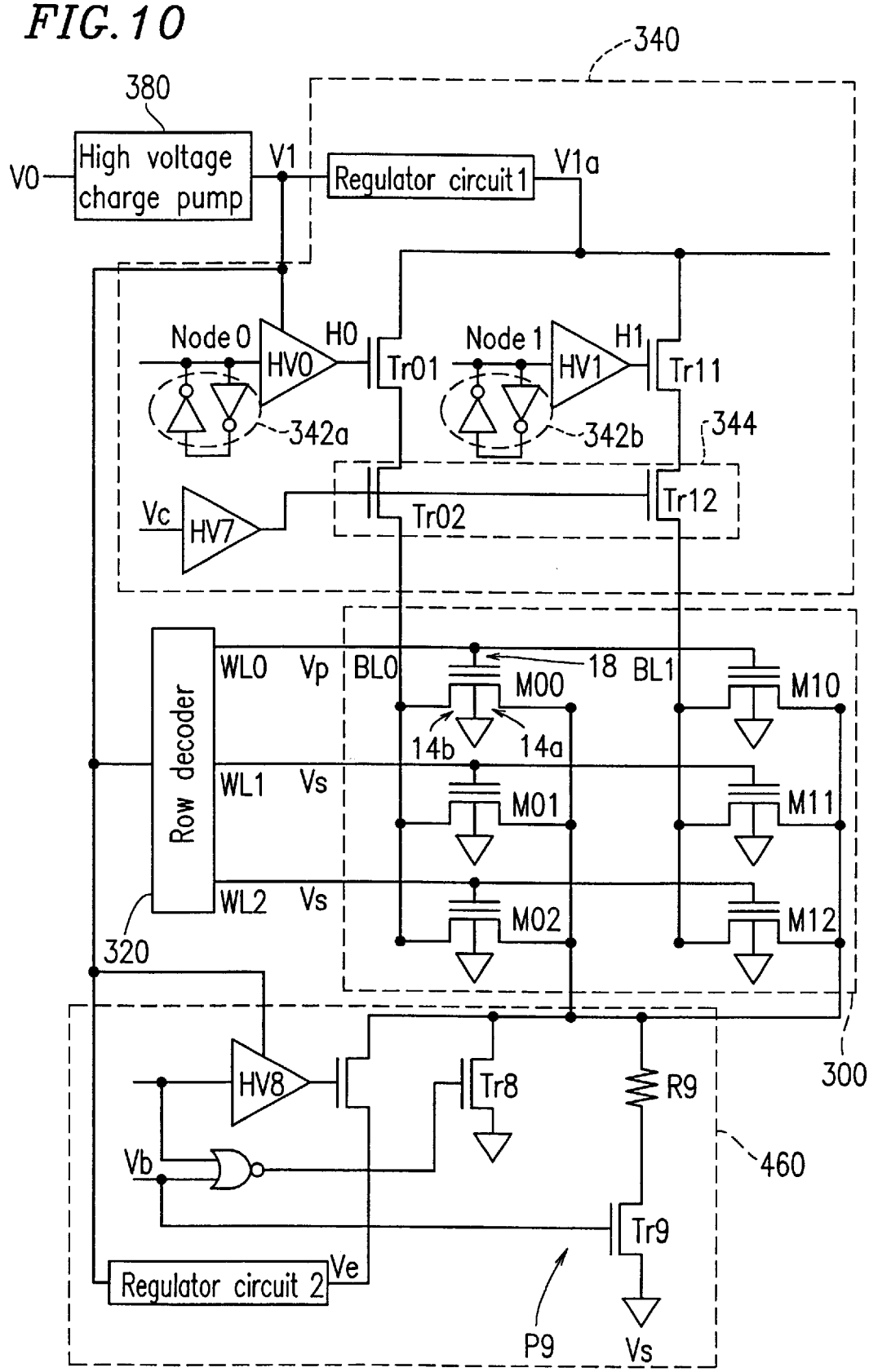
FIG. 10 illustrates the structure of a write circuit of the non-volatile semiconductor memory device according to Embodiment 1 of the present invention.

The write circuit of FIG. 10 further includes a row decoder 320 for supplying a voltage signal to the control gate 18 of each of the memory cells M via the word line WL, a program voltage application circuit 340 for applying a voltage signal to the drain 14b of the memory cell M via a bit line BL, a source voltage application circuit 460 for applying a voltage signal to the common source line 14A, and a high voltage charge pump 380 for supplying a voltage to these circuits.

The source-voltage application circuit 460 of the write circuit of the present embodiment includes a voltage path P9 between the common source line 14A and the substrate 10 (semiconductor base). The voltage path P9 is formed by a MOS transistor Tr9 controlled by a control signal Vb and a resistive element R9 (e.g., about 60 kΩ).

An exemplary write operation will now be described while describing the details of the write circuit of FIG. 10. Consider a case where data "0" (write enabled) and data "1" (write prohibited) are written to the memory cells M00 and M10, respectively, which are connected to the word line WL0, while no data is written to the memory cells M01, M11 and M02, M12, which are connected to the respective word lines WL1 and WL2.

When the write operation is initiated, the high voltage charge pump 380 increases the supply voltage V0 from a voltage source (not shown) so as to output a voltage V1 of 8 V, for example. The voltage V1 is decoded by the row decoder 320 into a voltage Vp of 8 V, for example, and output to the word line WL0. Whereas, the voltage Vs of 0 V, for example, is output from the row decoder 320 to the word lines WL1 and WL2. Each of these voltages are applied to the control gate 18 of the memory cell M which is connected to the respective word line WL, thereby controlling whether or not to perform a write operation to the memory cell M.

Figure 11:
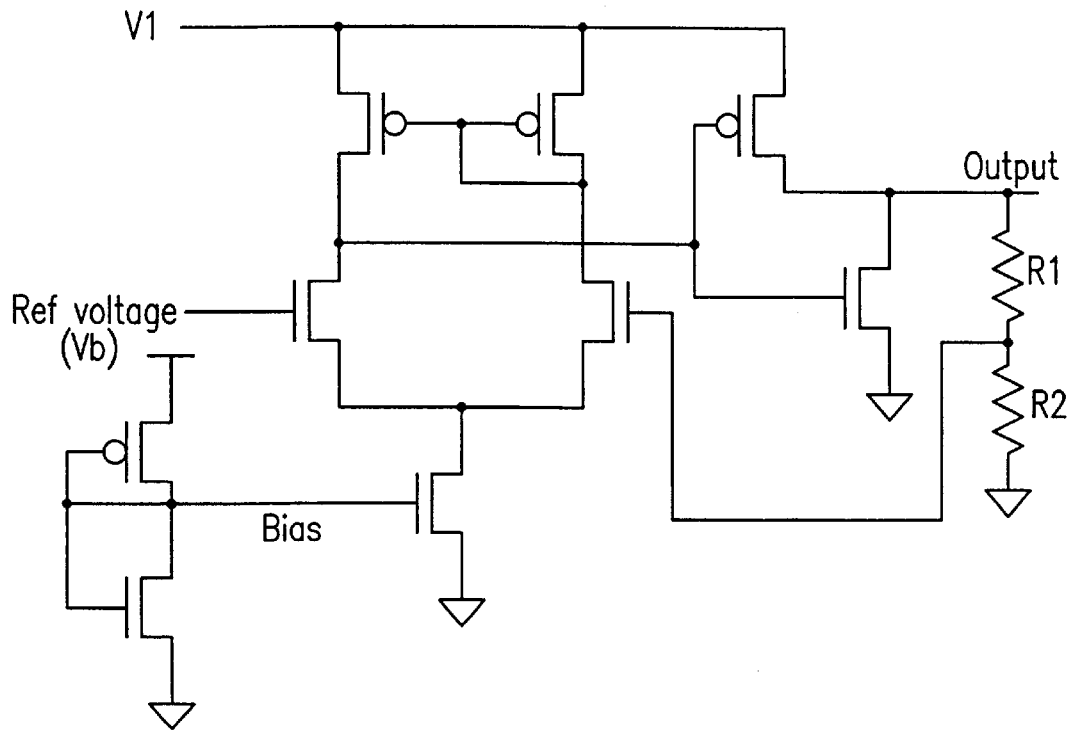
FIG. 11 illustrates an exemplary structure of a regulator circuit used in the non-volatile semiconductor memory device according to Embodiment 1 of the present invention.

The operation of applying a voltage to the drain 14b of the memory cell M via the bit line BL will be described. The voltage V1 from the high voltage charge pump 380 is regulated by the regulator circuit 1 to provide a stable voltage V1a (e.g., 6.5 V). Whether or not the voltage V1a is to be applied to each bit line BL is controlled by the MOS transistors (Tr01 and Tr02 or Tr11 and Tr12) which is connected to the bit line BL. The MOS transistors Tr01 and Tr11 are controlled by data which is externally provided via a node 0 and a node 1, respectively. Whereas the MOS transistors Tr02 and Tr12 together form a column switch 344 and are commonly controlled by an externally provided control signal Vc. The regulator circuit 1 has a structure as shown in FIG. 11.

At the initiation of a write operation, the node 0 is brought to a "high" level (e.g., the level of the voltage V0) and the node 1 is brought to a "low" level (e.g., the reference voltage of 0 V) by the externally provided data. The "high" level at the node 0 is latched by a latch circuit 342a and then level-converted by a level shift circuit HV0 into the "high" level which corresponds to the level of the voltage Vp at the node H0. Thus, the MOS transistor Tr01 is turned ON. On the other hand, the "low" level at the node 1 is latched by the latch circuit 342b and then level-converted by a level shift circuit HV1 whose output is still at the "low" level (0 V). Thus, the MOS transistor Tr11 is OFF.

The externally provided control signal Vc at the "high" level (e.g., the level of the voltage V0) is provided to the column switch 344 which is provided in a subsequent stage following the MOS transistors Tr01 and Tr11. The control signal Vc is level-converted by a level shift circuit HV7 into the "high" level which corresponds to the level of the voltage Vp. This signal is input to all of the MOS transistors in the column switch 344, whereby the MOS transistors Tr02 and Tr12 are both turned ON.

Since the MOS transistors Tr01 and Tr02 are ON, the voltage V1a (e.g., 6.5 V) is applied to the memory cell M00 via the bit line BL0. On the other hand, the MOS transistor Tr11 is OFF, and thus the bit line BL1 is floating, whereby there is no voltage application to the memory cell M10.

The voltage application to the source 14a which is connected to the common source line 14A is performed via the resistive element R9. When the write operation is initiated, the control signal Vb is brought to the "high" level (the level of V0). Thus, the MOS transistor Tr9 is turned ON, and the terminal of the resistive element R9 on the MOS transistor Tr9 side is brought to the level of a reference voltage Vs (e.g., 0 V), which is the voltage of the substrate 10. In the memory cell M00 to which data is to be written, the potential of the drain 14b is 6.5 V, whereby a large current (e.g., 50 $\mu$A) flows therethrough though only momentarily. The current flows into the common source line 14A, and the potential of the common source line 14A is increased to be about 3 V with respect to the reference voltage Vs by the resistive element R9 (about 60 k$\Omega$) which is provided between the common source line 14A and the substrate 10.

Thus, the voltage on the common source line 14A increases, and the potential of the common source line 14A is made to be about 3 V. As a result, the voltage application as shown in Table 3 is realized, thereby performing a write operation using secondary electrons. The degree of increase in the voltage on the common source line 14A is influenced by the current supply capability of the high voltage charge pump 380, the resistance of the common source line 14A, the ON resistance of the memory cell, etc., in addition to the resistance value of the resistive element R9. Therefore, it is preferred to set the resistance value of the total resistive element while considering these factors comprehensively. This also applies to Embodiments 2 and 3 of the present invention to be described below.

The regulator circuit 2 shown at the bottom of FIG. 10 is provided for applying the voltage Ve (e.g., 6 V) to the common source line 14A in an erase operation, and is irrelevant to the write operation. Thus, the regulator circuit 2 will not be further described below.

Figure 4:
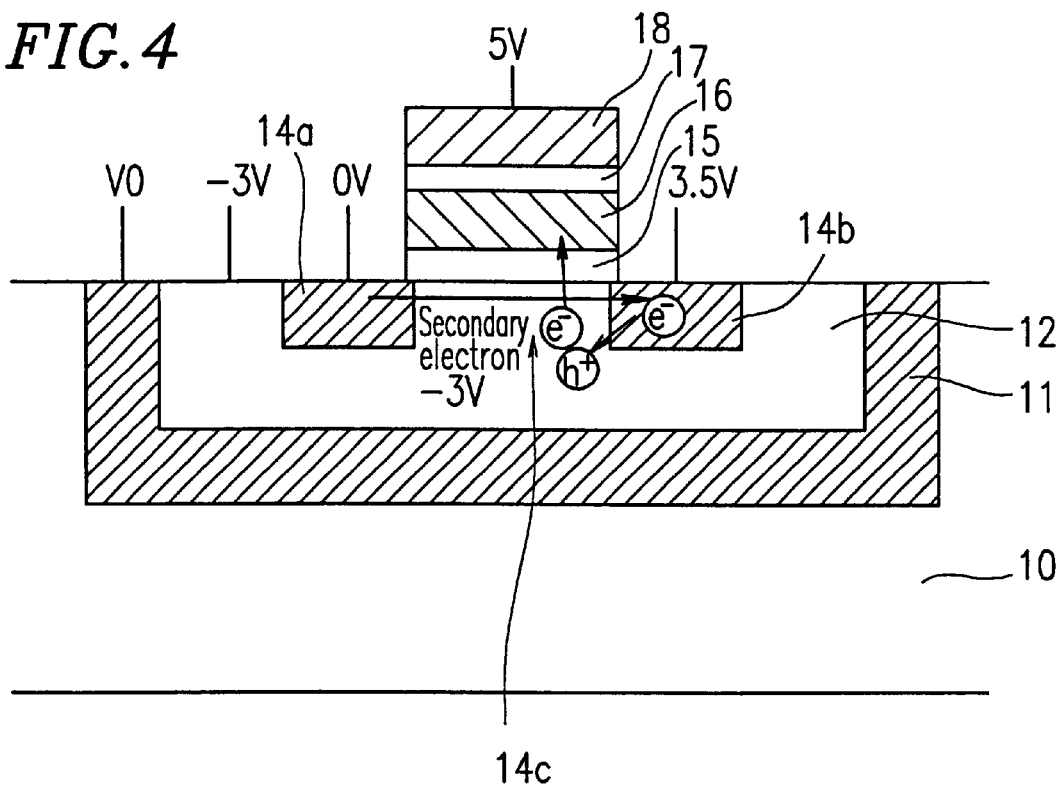
FIG. 4 illustrates the structure of a memory cell of a non-volatile semiconductor memory device of Conventional Example 2 and the principle of a write method therefor.
Figure 5:
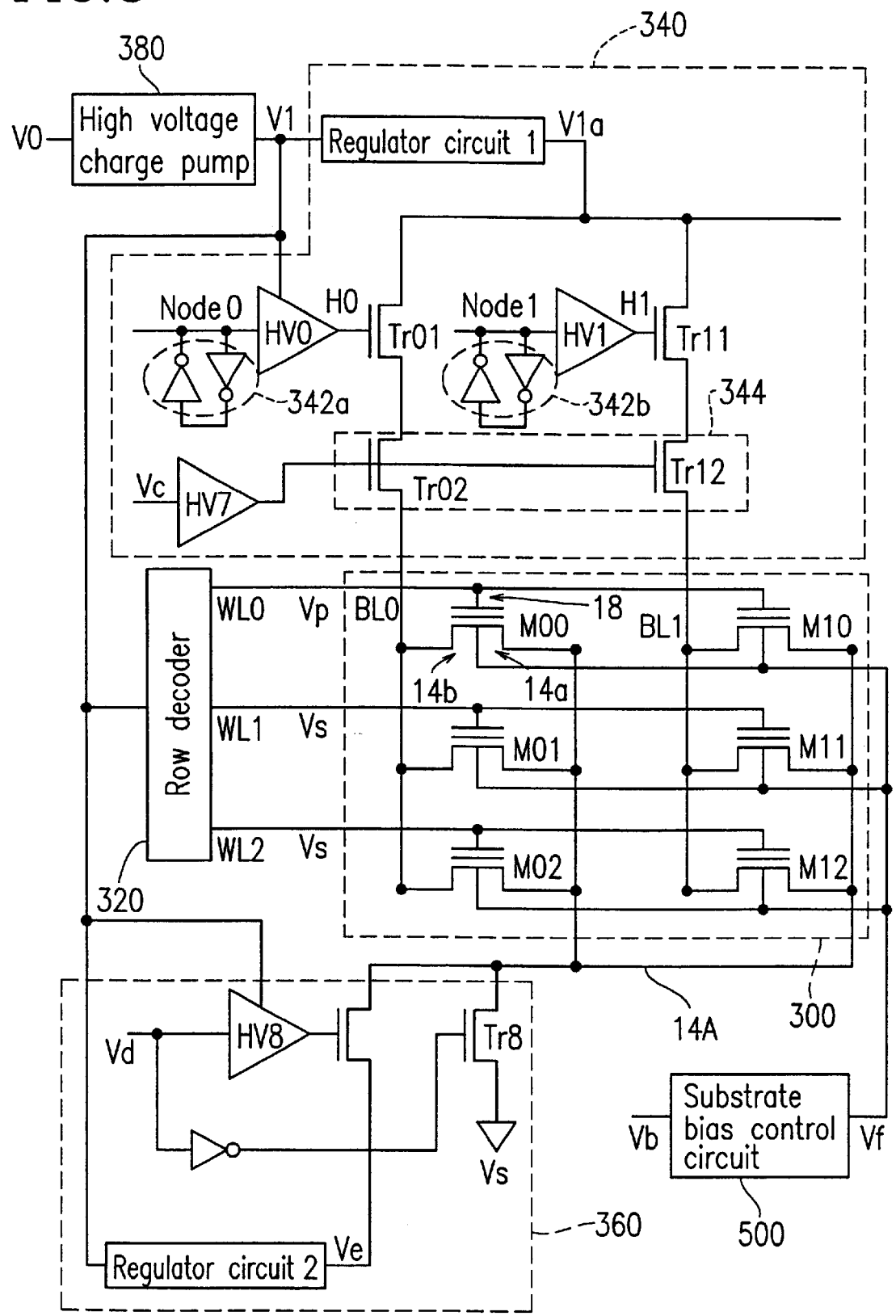
FIG. 5 illustrates the structure of a write circuit of the non-volatile semiconductor memory device of Conventional Example 2.
Figure 6:
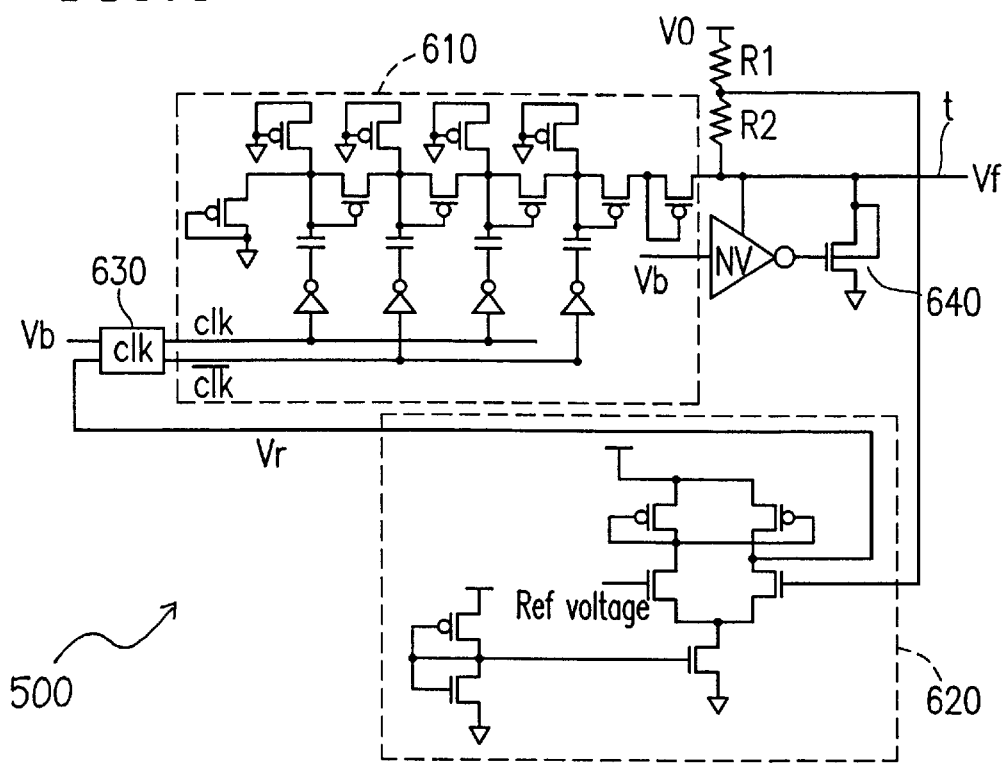
FIG. 6 illustrates the structures of a negative voltage pump circuit and a convergence circuit (substrate bias circuit) used in the non-volatile semiconductor memory device of Conventional Example 2.
Figure 7:
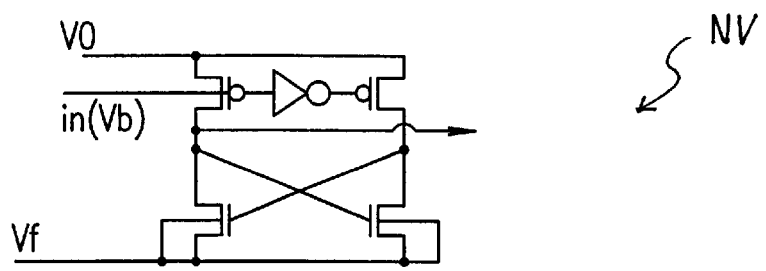
FIG. 7 illustrates the structure of a negative voltage level shifter used in the non-volatile semiconductor memory device of Conventional Example 2.

According to the present embodiment, the potential of the common source line 14A is increased by using the resistive element R9. Thus, it is possible to obtain a sufficient potential difference between the common source line 14A and the substrate 10 while maintaining the potential of the substrate 10 at the reference voltage Vs of 0 V. Therefore, it is possible to perform the write operation at a high speed because it is not necessary to charge the substrate 10 to a negative voltage as in Conventional Example 2 (FIG. 4 and Table 2).

After data has been written to the memory cell M00, a program verify operation is performed for verifying the threshold voltage of the memory cell M00. When it is determined that the threshold voltage of the memory cell M00 is equal to or greater than 3.5 V, the write operation is completed. When the threshold voltage of the memory cell M00 is less than 3.5 V, a write operation is repeated by again applying a write signal. Thus, the write and verify operations are performed alternately to each other so that the threshold voltage of the memory cell is controlled to be a predetermined value (equal to or greater than 3.5 V) by verifying the threshold voltage.

According to the present embodiment, the total write time including overheads, such as the set-up time is less than or equal to 14 $\mu$s. The particulars of the time period are as follows: pulse application time: 7 $\mu$s, word line set-up time: 100 ns, bit line set-up time: 100 ns, charge pump start-up time: 2 $\mu$s, discharge time for the charge pump voltage, etc.: 1 $\mu$s, time for the source voltage to be stabilized: 500 ns, source voltage discharge time: 200 ns, verify time: 2 $\mu$s, and circuit overhead: 1 $\mu$s. The word line set-up time can be ignored in the calculation because the word line set-up time can overlap the charge pump set-up time. Therefore, the total amount of time required for the entire write operation is about 14 $\mu$s (7 $\mu$s+2 $\mu$s+1 $\mu$s+2 $\mu$s+1 $\mu$s+100 ns+500 ns+200 ns).

As compared to Conventional Example 2, the present embodiment additionally requires the time for the source-voltage to be stabilized and the source voltage discharge time. However, the present embodiment does not require the long time of about 40 $\mu$s which is required to charge or discharge the p-well of Conventional Example 2, thereby significantly reducing the total write time. As shown in FIG. 10, the control signal Vb is input to the MOS transistor Tr8 via a NOR circuit. Therefore, by turning ON the MOS transistor Tr8 during the verify operation (where the control signals Vb and Vd are both at the "low" level), it is possible to reduce the amount of time required to discharge the common source line 14A to the level of the reference voltage Vs.

Moreover, it is not necessary to provide a negative voltage charge pump whose efficiency is as low as about 10%, so that it is possible to reduce the total layout area by the area which would otherwise be occupied by such a charge pump. Moreover, since the present embodiment does not employ the triple-well structure as in Conventional Example 2 (FIG. 4), there is no n-well or p-well. Therefore, the present embodiment is advantageous in terms of a reduction in the layout area of the memory cell array.

(Embodiment 2)

A method and a circuit for writing data to a non-volatile semiconductor memory device according to Embodiment 2 of the present invention will be described.

Figure 12:
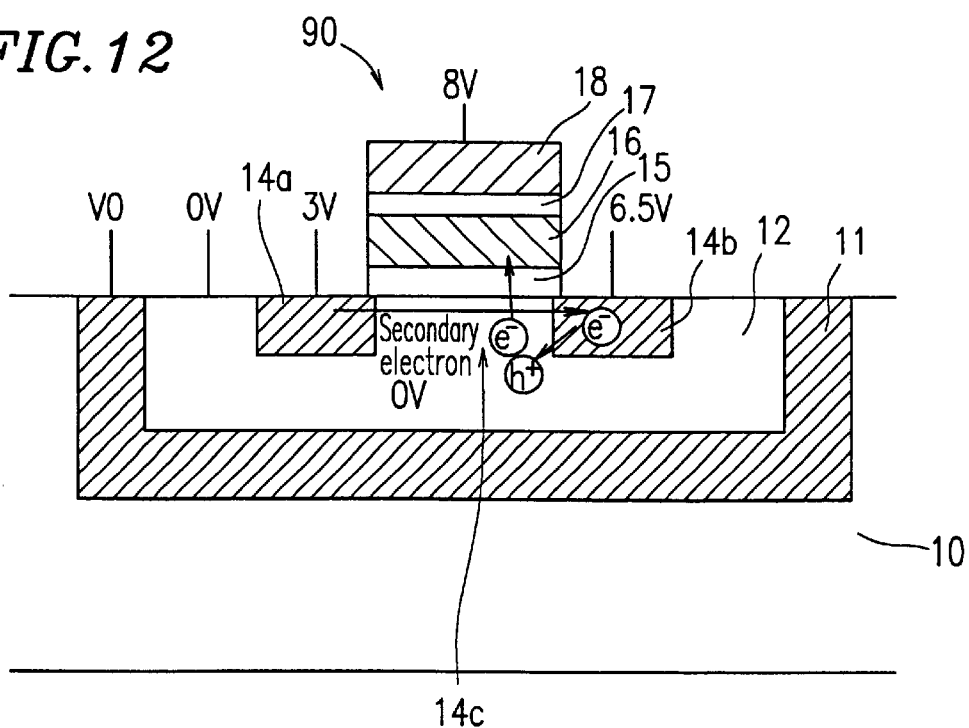
FIG. 12 illustrates the structure of a memory cell of a non-volatile semiconductor memory device according to Embodiment 2 of the present invention and the principle of a write method therefor.

In the present embodiment, the memory cells of the non-volatile semiconductor memory device are provided on a triple-well structure. FIG. 12 is a cross-sectional view schematically illustrating the structure of the memory cell 90. The triple-well structure includes the substrate 10, an n-well (n$^-$ type) 11 on the substrate 10, and a p-well (p$^-$ type) 12 on the n-well 11. The p-well 12 is electrically isolated from the substrate 10 by the n-well 11. The memory cell 90 itself is the same as that shown in FIG. 9 (Embodiment 1) and thus is provided with the same reference numerals.

The write method of the present embodiment is basically the same as that of Embodiment 1, using a write circuit (FIG. 10) and a method similar to that of Embodiment 1. In Embodiment 2, however, the resistive element R9 (FIG. 10) is provided between the p-well 12 (semiconductor base) and the common source line 14A. In the write operation, the reference voltage Vs of 0 V is applied to the p-well 12, and the supply voltage V0, for example, is applied to the n-well 11. Voltages of 8 V and 6.5 V, for example, are applied to the control gate 18 and the drain 14b, respectively, as in Embodiment 1. The potential of the source 14a is eventually increased to be 3 V by the resistive element R9 based on a principle similar to that described for Embodiment 1. Thus, in the present embodiment, as in Embodiment 1, secondary electrons are generated on the drain side of the memory cell and data is written by the secondary electrons.

The advantages of providing the memory cell 90 on the triple-well structure are as follows.

It is known in the art that the reliability characteristics such as an endurance characteristic and a retention characteristic are degraded by BTBT (band to band tunneling) which occurs in an erase operation. BTBT is a current which occurs on the source side of the memory cell when a negative voltage and a high positive voltage are applied to the control gate 18 and the source 14a, respectively, as in the erase operation described for Embodiment 1, for example.

This current can be prevented by performing a channel erase operation, i.e., an erase operation while controlling the p-well 12 and the source 14a to be at the same potential. In the channel erase operation, a high voltage, as that applied to the source, is applied to the p-well so that electrons are withdrawn from the floating gate in the channel region, not from the source side of the memory cell. In the case of a memory cell having a structure as shown in FIG. 12, a high voltage of 8 V, for example, may be applied to the p-well 12 and the source 14a, while applying a voltage of −9 V, for example, to the control gate 18 in an erase operation, so that it is possible to withdraw electrons from the floating gate 16 to the channel layer 14c, thereby reducing the threshold voltage. In such an erase operation using a channel region, no BTBT current, and thus no large current, is generated. In order to be able to employ the channel erase operation, it is preferred to use a triple-well structure. This is because when a triple-well structure is used, the p-well 12 is electrically isolated from the p-substrate 10, whereby it is possible to apply a desired voltage to the p-well 12 and to maintain the potential of the p-substrate 10 at the reference voltage Vs.

However, where the p-well 12 and the p-substrate 10 are isolated from each other, a problem may occur as follows during a write operation if data is written by using CHEs. As described above in the Related Art section, a large current may flow through the memory cell during a write operation with a current flow occurring at the same time on the p-well 12 side of the memory cell. For example, when the level of the current flow is 500 $\mu$A per one cell the current flowing through the p-well 12 is 100 $\mu$A. On the other hand, the potential of the p-well 12 in the triple-well structure can only be controlled from the lateral side thereof, whereby the resistance is higher than that of the p-well on an ordinary substrate, and as such it is difficult to stabilize the potential. Therefore, if a current flows into the p-well 12, the potential of the p-well 12 increases, whereby it is not possible to perform a normal write operation.

On the contrary, in the write method using secondary electrons, the current flow per one cell is less than or equal to 10 $\mu$A, and the current flowing through the p-well 12 is as low as 5 $\mu$A or less. Thus, even when the memory cell is provided on the triple-well structure, the well potential does not increase, and it is possible to perform a stable, normal write operation.

In the present embodiment, as in Embodiment 1, a negative voltage is not used for the semiconductor base (the p-well 12), whereby effects similar to those of Embodiment 1 can be obtained. Since the present embodiment employs a write method using secondary electrons as in Embodiment 1, there is no cell current and no increase in the potential of the p-well 12, thereby realizing a stable write operation, as compared to the conventional method using CHEs.

As described above, the write method of the present embodiment using secondary electrons is effective not only for controlling the current which is required for a write operation but also for solving the problem which would otherwise occur when one employs a triple-well structure which is required for performing a channel erase operation.
(Embodiment 3)

A method and a circuit for writing data to a non-volatile semiconductor memory device according to Embodiment 3 of the present invention will be described.

Figure 13:
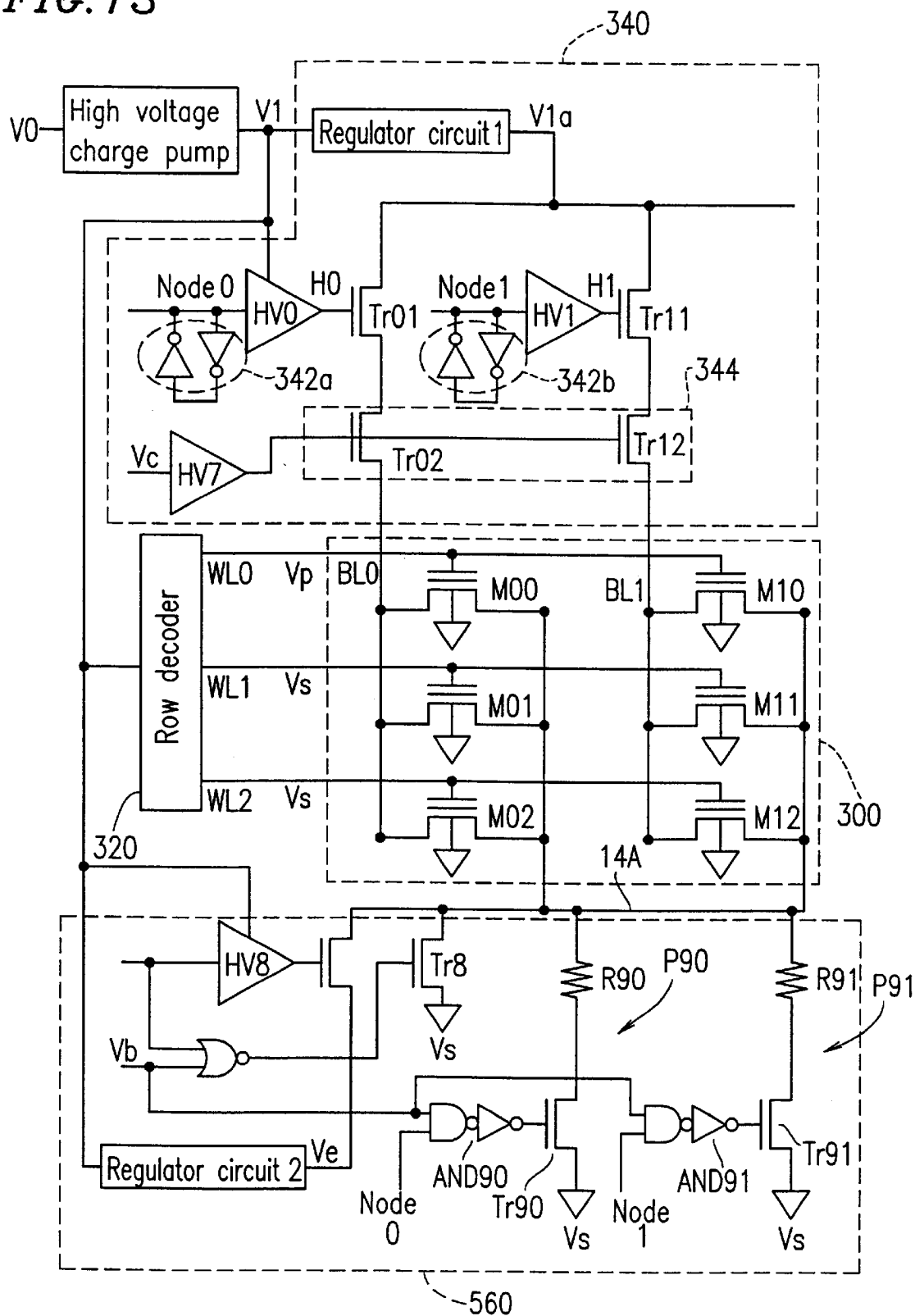
FIG. 13 illustrates the structure of a write circuit of a non-volatile semiconductor memory device according to Embodiment 3 of the present invention.

FIG. 13 illustrates the structure of a write circuit of a non-volatile semiconductor memory device according to the present embodiment. As shown in FIG. 13, the difference between the write circuit of the present embodiment and the write circuits of Embodiments 1 and 2 is the provision of a plurality of voltage paths P90, P91, . . . (each including a resistive element R and an MOS transistor Tr) between the common source line 14A and the semiconductor base (reference voltage Vs) in a source voltage application circuit 560 of the write circuit. The number of the voltage paths P90, P91, . . . is equal to the number of the bit lines BL or the number of columns of the memory cells M. The resistive elements R (R90 and R91) and the MOS transistor Tr (Tr90 and Tr91) are provided to respectively correspond to the bit lines BL. Each of the MOS transistors Tr are opened/closed by the control signal Vb (which is at the high level during a write operation) and an output from an AND circuit (AND90, AND91) which receives data to be written to the memory cell M.

The other elements of the write circuit (the memory cell array 300, the row decoder 320, the program voltage application circuit 340, the high voltage charge pump 380, etc.) are basically the same as those shown in FIG. 10 and thus will not be further described below. In the present embodiment, the structure of the memory cell of the non-volatile semiconductor memory device may be similar to that of Embodiment 1 (FIG. 9) or that of Embodiment 2 (FIG. 12).

The advantages of providing a number of voltage paths between the common source line 14A and the reference voltage Vs while determining the number in view of the variations in the number of memory cell columns to which a write operation is to be performed simultaneously will be described.

Typically, a commercially available device is designed so as to be capable of writing, for example, 16 bits simultaneously in order to increase the write efficiency. Particularly, when secondary electrons are used, it is possible to reduce the amount of current to be consumed by the memory cells, whereby it is possible to simultaneously write an even larger amount of data, e.g., 32 bits to the corresponding number of memory cells. In such a case, the number of cells to which data can be written simultaneously varies depending upon the data to be written. For example, the amount of current to be consumed by the memory cell array in a case where data "0" (write enabled) is written to one of 16 cells while writing data "1" (write prohibited) to the other 15 cells is 16 times as large as the amount of current to be consumed by the memory cell array in a case where data "0" is written to all the 16 cells. Therefore, the write efficiency may decrease because the voltage value at which the common source line 14A in Embodiment 1 (where only one resistive element is used) begins to float varies depending upon the data to be written.

In order to address this problem, in the present embodiment, a plurality of resistive elements R to be connected to the common source line 14A are provided so that the resistance between the common source line 14A and the reference voltage Vs is reduced when the amount of current to be consumed by the memory cell array is large, whereby the increase in the potential of the common source line 14A is uniform.

The write operation according to the present embodiment will now be described in greater detail with reference to FIG. 13. Consider a case where data is written to the memory cells M00 and M10, which are connected to the word line WL0, while no data is written to the memory cells M01, M11 and M02, M12, which are connected to the respective word lines WL1 and WL2.

First, the-operation of writing data "0" (write enabled) to the memory cell M00, which is connected to the word line WL0, while writing data "1" (write prohibited) to the memory cell M10 will be described.

When the write operation is initiated, the high voltage charge pump 380 increases the supply voltage V0 from a voltage source (not shown) so as to output the voltage V1 of 8 V, for example. The voltage V1 is decoded by the row decoder 320 into a voltage Vp of 8 V, for example, and output to the word line WL0. Whereas, the voltage Vs of 0 V, for example, is output from the row decoder 320 to the word lines WL1 and WL2.

The operation of applying a voltage to the drain 14b of the memory cell H via the bit line BL will be described. The voltage V1 from the high voltage charge pump 380 is regulated by the regulator circuit 1 to provide the stable voltage V1a (e.g., 6.5 V). Whether or not the voltage V1a is to be applied to each bit line BL is controlled by the MOS transistors (Tr01 and Tr02 or Tr11 and Tr12) which is connected to the bit line BL. The MOS transistors Tr01 and Tr11 are controlled by data which is externally provided via the node 0 and the node 1, respectively. Whereas the MOS transistors Tr02 and Tr12 together form the column switch 344 and are commonly controlled by the externally provided control signal Vc.

At the initiation of a write operation, the node 0 is brought to the "high" level (e.g., the level of the voltage V0) and the node 1 is brought to the "low" level (e.g., the reference voltage of 0 V) by the externally provided data. The "high" level at the node 0 is latched by the latch circuit 342a and then level-converted by the level shift circuit HV0 into the "high" level which corresponds to the level of the voltage Vp at the node H0. Thus, the MOS transistor Tr01 is turned ON. On the other hand, the "low" level at the node 1 is latched by the latch circuit 342b and then level-converted by the level shift circuit HV1 whose output is still at the "low" level (0 V). Thus, the MOS transistor Tr11 is OFF.

The externally provided control signal Vc at the "high" level (e.g., the level of the voltage V0) is provided to the column switch 344 which is provided in a subsequent stage following the MOS transistors Tr01 and Tr11. The control signal Vc is level-converted by the level shift circuit HV7 into the "high" level which corresponds to the-level of the voltage Vp. This signal is input to all of the MOS transistors in the column switch 344, whereby the MOS transistors Tr02 and Tr12 are both turned ON.

Since the MOS transistors Tr01 and Tr02 are ON, the voltage V1a (e.g., 6.5 V) is applied to the memory cell M00 via the bit line BL0. On the other hand, the MOS transistor Tr11 is OFF, and thus the bit line BL1 is floating, whereby there is no voltage application to the memory cell M10.

The voltage application to the source 14a which is connected to the common source line 14A is performed via the resistive elements R90, R91. As described above, the node 0 is at the "high" level and the node 1 is at the "low" level, whereby the MOS transistor Tr90 which is connected to the resistive element R90 is turned ON by the AND circuit AND90, and the MOS transistor Tr91 which is connected to the resistive element R91 is held OFF by the AND circuit AND91. Therefore, the control circuit including the AND circuits provides a control such that the number of columns of memory cells to which data is written simultaneously and the number of voltage paths P which are turned ON simultaneously in each block are equal to each other.

As the MOS transistor Tr90 is turned ON, the terminal of the resistive element R90 on the MOS transistor Tr90 side is brought to the level of the reference voltage Vs (e.g., 0 V), which is the voltage of the semiconductor base. In the memory cell M00 to which data is written, a large current (e.g., 50 $\mu$A) flows therethrough though only momentarily. The current flows into the common source line 14A, and the potential of the common source line 14A is increased to be about 3 V with respect to the reference voltage Vs by the resistive element R90 (about 60 k$\Omega$) which is provided between the common source line 14A and the substrate 10.

Thus, the voltage on the common source line 14A increases, and the potential of the common source line 14A is made to be about 3 V. As a result, the voltage application as shown in Table 3 is realized. In the present embodiment, as in Embodiments 1 and 2, secondary electrons are generated on the drain side of the memory cell under such voltage conditions, and the write operation is performed by the secondary electrons. Then, as in Embodiment 1, a program verify operation is performed for verifying the threshold voltage of the memory cell M00. When it is determined that the threshold voltage of the memory cell M00 is equal to or greater than 3.5 V, the write operation is completed. When the threshold voltage of the memory cell M00 is less than 3.5 V, a write operation is repeated by again applying a write signal. Thus, the write and verify operations are performed alternately to each other so that the threshold voltage of the memory cell is controlled to be a predetermined value (equal to or greater than 3.5 V) by verifying the threshold voltage.

Next, the operation of writing data "0" (write enabled) to both the of the memory cells M00 and M10 will be described. The node 0 and the node 1 are both brought to the "high" level by an externally provided control signal, and the control signal Vc is also brought to the "high" level. Thus, a current flows out from both of the memory cells M00 and M10. Since the current flowing through a single memory cell is about 50 $\mu$A, the total amount of current flowing through the common source line 14A is about 100 $\mu$A when data is written to the two memory cells.

Since the node 0 and the node 1 are both at the "high" level, both of the respective voltage paths to which the resistive elements R90 and R91 are connected become conductive, thereby allowing the cell current to flow therethrough. Since the resistance of each of the resistive elements R90 and R91 is about 60 k$\Omega$, and the resistance between the common source line 14A and the reference voltage Vs is about 30 k$\Omega$, the potential of the common source line 14A is increased to be about 3 V. As the potential of the common source line 14A is increased to be about 3 V, the secondary electrons are generated on the drain side of the memory cell, and the write operation is performed by the secondary electrons. Then, as in Embodiment 1, a program verify operation is performed for verifying the threshold voltage of the memory cell M00, M10. When it is determined that the threshold voltage of the memory cell M00, M10 is equal to or greater than 3.5 V, the write operation is completed. When the threshold voltage of the memory cell M00, M10 is less than 3.5 V, a write operation is repeated by again applying a write signal. Thus, the write and verify operations are performed alternately to each other so that the threshold voltage of the memory cell is controlled to be a predetermined value (equal to or greater than 3.5 V) by verifying the threshold voltage.

The erase operation and the read operation are similar to those of Embodiment 1 and thus will not be further described below.

According to the present invention, it is possible to perform a stable write operation while suppressing the variations in the source potential which may occur due to differences in a data pattern.

While in the present embodiment two columns of memory cells M are included in one block and, accordingly, two voltage paths P90 and P91 are provided, the present invention is not limited to this specific example. Where there are more than two columns of memory cells in one block, the number of resistive elements R and the number of MOS transistors Tr can be increased to correspond to the number of columns of memory cells in one block. In such a case, the resistance value of each resistive element R may be appropriately adjusted in view of the desired potential of the common source line 14A.

(Embodiment 4)

A method and a circuit for writing data to a non-volatile semiconductor memory device according to Embodiment 4 of the present invention will be described.

In the embodiments described above, the potential of the common source line 14A is controlled to be a desired value by using the voltage path P including the resistive element R. On the contrary, in the present embodiment, a desired voltage is supplied from the outside of the write circuit directly to the common source line 14A. As the externally provided desired voltage, for example, the supply voltage from the voltage source may be used.

In the present embodiment, the memory cell of the non-volatile semiconductor memory device may have the structure as described above for Embodiment 1 with reference to FIG. 9, for example. Instead of the structure shown in FIG. 9, the structure described above for Embodiment 2 with reference to FIG. 12 (the triple-well structure) can be used.

The principle of operation of the memory cell in the write mode in Embodiment 4 will now be described based on the memory cell 90 shown in FIG. 9. For each of the write mode, the erase mode and the read mode, the voltages to be applied to the control gate 18, the source/drain 14a, 14b and the substrate 10, respectively, are as shown in Table 3.

In the write (programming) mode, a voltage of 8 V, for example, is applied to the control gate 18 of the memory cell to which data is to be written, a voltage of 6.5 V, for example, is applied to the drain 14b thereof, a voltage of 3 V, for example, is applied to the source 14a, and the substrate 10 is controlled to be at the reference voltage of 0 V, for example. The potential of the drain of each memory cell to which data is not written is set to be 0 V. Under such voltage conditions, a current (electrons) flows through the channel layer 14c, thereby generating holes through impact ionization in the vicinity of the drain 14b, as shown in FIG. 9. The holes are accelerated and move toward the substrate 10. The holes generate hot electrons (secondary electrons) as they move across the depletion layer between the drain 14b ($n^+$) and the substrate 10 ($p^-$). The hot electrons are injected into the floating gate 16, thereby increasing the threshold voltage to be equal to or greater than 3.5 V. The threshold voltage for the memory array to which data has been written is as shown in FIG. 2 by the curve labelled "Programmed state (a)".

Figure 8:
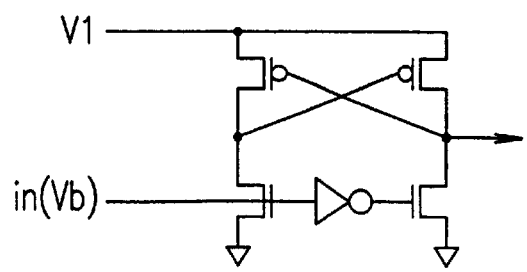
FIG. 8 illustrates the structure of a high voltage level shifter in the write circuit of FIG. 5.
Figure 14:
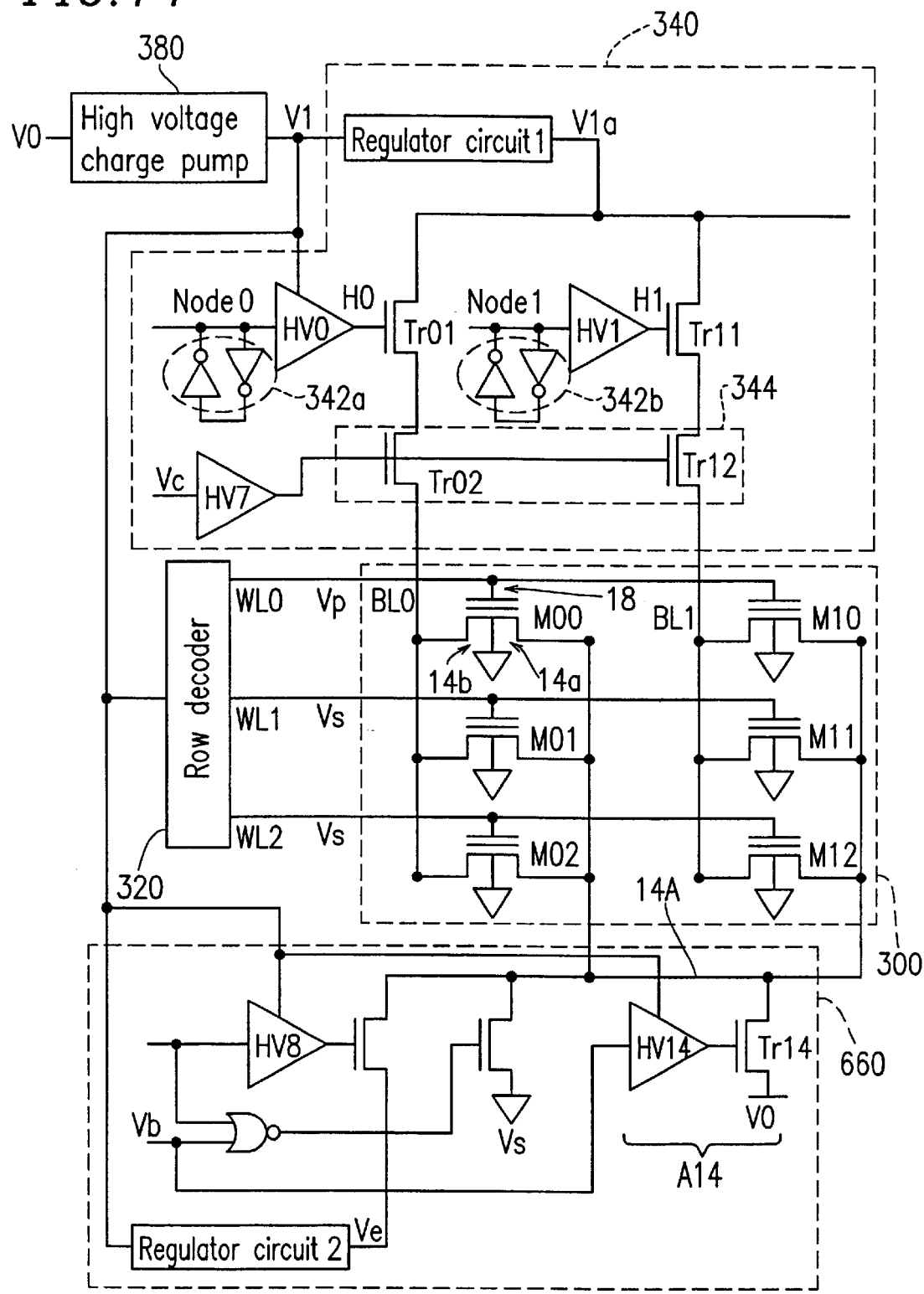
FIG. 14 illustrates the structure of a write circuit of a non-volatile semiconductor memory device according to Embodiment 4 of the present invention.

FIG. 14 illustrates the structure of a write circuit of a non-volatile semiconductor memory device according to the present embodiment. As shown in FIG. 14, the difference between the write circuit of the present embodiment and the write circuits of Embodiments 1 to 3 is the provision of an external voltage supply circuit A14 instead of the voltage path including a resistive element connected to the common source line 14A. The external voltage supply circuit A14 includes an MOS transistor Tr14 and a level shift circuit HV14. The MOS transistor Tr14 is opened/closed by a voltage which is obtained by level-converting the control signal Vb (which is at the high level during a write operation) to 8 V, for example, by the level shift circuit HV14. When the MOS transistor Tr14 is turned ON, the supply voltage V0 is applied to the common source line 14A. The level shift circuit HV14 may be a level shift circuit having a structure as shown in FIG. 8. The other elements of the write circuit (the memory cell array 300, the row decoder 320, the program voltage application circuit 340, the high voltage charge pump 380, etc.) are basically the same as those shown in FIG. 10 and thus will not be further described below.

The write operation by the write circuit of FIG. 14 will now be described. Consider a case where data "0" (write enabled) and data "1" (write prohibited) are written to the memory cells M00 and M10, respectively, which are connected to the word line WL0, while no data is written to the memory cells M01, M11 and M02, M12, which are connected to the respective word lines WL1 and WL2.

When the write operation is initiated, the high voltage charge pump 380 increases the supply voltage V0 from a voltage source (not shown) so as to output a voltage V1 of 8 V, for example. The voltage V1 is decoded by the row decoder 320 into a voltage Vp of 8 V, for example, and output to the word line WL0. Whereas, the voltage Vs of 0 V, for example, is output from the row decoder 320 to the word lines WL1 and WL2. Each of these voltages are applied to the control gate 18 of the memory cell M which is connected to the respective word line WL, thereby controlling whether or not to perform a write operation to the memory cell M.

The operation of applying a voltage to the drain 14b of the memory cell N via the bit line BL will be described. The voltage V1 from the high voltage charge pump 380 is regulated by the regulator circuit 1 to provide a stable voltage V1a (e.g., 6.5 V). Whether or not the voltage V1a is to be applied to each bit line BL is controlled by the MOS transistors (Tr01 and Tr02 or Tr11 and Tr12) which is connected to the bit line BL. The MOS transistors Tr01 and Tr11 are controlled by data which is externally provided via the node 0 and the node 1, respectively. Whereas the MOS transistors Tr02 and Tr12 together form the column switch 344 and are commonly controlled by the externally provided control signal Vc. The regulator circuit 1 has a structure as shown in FIG. 11.

At the initiation of a write operation, the node 0 is brought to the "high" level (e.g., the level of the voltage V0) and the node 1 is brought to the "low" level (e.g., the reference voltage of 0 V) by the externally provided data. The "high" level at the node 0 is latched by the latch circuit 342a and then level-converted by the level shift circuit HV0 into the "high" level which corresponds to the level of the voltage Vp at the node H0. Thus, the MOS transistor Tr01 is turned ON. On the other hand, the "low" level at the node 1 is latched by the latch circuit 342b and then level-converted by the level shift circuit HV1 whose output is still at the "low" level (0 V). Thus, the MOS transistor Tr11 is OFF.

The externally provided control signal Vc at the "high" level (e.g., the level of the voltage V0) is provided to the column switch 344 which is provided in a subsequent stage following the MOS transistors Tr01 and Tr11. The control signal Vc is level-converted by the level shift circuit HV7 into the "high" level which corresponds to the level of the voltage Vp. This signal is input to all of the MOS transistors in the column switch 344, whereby the MOS transistors Tr02 and Tr12 are both turned ON.

Since the MOS transistors Tr01 and Tr02 are ON, the voltage V1a (e.g., 6.5 V) is applied to the memory cell M00 via the bit line BL0. On the other hand, the MOS transistor Tr11 is OFF, and thus the bit line BL1 is floating, whereby there is no voltage application to the memory cell M10.

For the common source line 14A, the MOS transistor Tr14 is turned ON by the transition of the control signal Vb to the "high" level, and the supply voltage V0 (about 3 V) is applied to the common source line 14A. The amount of time for which a voltage is applied to the common source line 14A may be set to be about 500 ns in the case of 64 kB/block. Thus, the potential of the source 14a becomes about 3 V.

Thus, the voltage application as shown in Table 3 is realized, so that a current flows through the memory cell M00, thereby performing a write operation using secondary electrons. In such a case, the current flow per one cell is about 10 $\mu$A. In Embodiments 1 to 3, there is a current flow of about 50 $\mu$A until there is a cell current flow to increase the source voltage so that the backgate bias is applied. In the present embodiment, however, the backgate bias is applied to the source from the beginning, thereby reducing the maximum current which may flow through the memory cell.

After data has been written to the memory cell M00, a program verify operation is performed for verifying the threshold voltage-of the memory cell M00. When it is determined that the threshold voltage of the memory cell M00 is equal to or greater than 3.5 V, the write operation is completed. When the threshold voltage of the memory cell M00 is less than 3.5 V, a write operation is repeated by again applying a write signal. Thus, the write and verify operations are performed alternately to each other so that the threshold voltage of the memory cell is controlled to be a predetermined value (equal to or greater than 3.5 V) by verifying the threshold voltage. The erase operation and the read operation are similar to those of Embodiment 1 and thus will not be further described below.

According to the present embodiment, the potential of the common source line 14A is fixed to the value of the supply voltage V0. As a result, it is possible to avoid the problem which may occur when a resistive element is inserted between the common source line and the reference voltage Vs (i.e., the problem that the voltage of the common source line is varied by the characteristics of the memory cells, and thus the source voltage cannot be determined precisely, whereby it is not possible to stably perform a write operation). There is no variation in the source potential which may occur due to differences in a data pattern, whereby it is possible to realize a stable write operation.

According to the present embodiment, the substrate potential (Vs) is 0 V, and it is not necessary to charge the substrate to a negative voltage, whereby it is possible to realize a high-speed write operation. Moreover, it is not necessary to use a negative voltage charge pump whose efficiency is as low as about 10%, so that it is possible to reduce the total layout area by the area which would otherwise be occupied by such a charge pump.

According to the present embodiment, the total write time including overheads, such as the set-up time is less than or equal to 14 $\mu$s. The particulars of the time period are as follows: pulse application time: 7 $\mu$s, word line set-up time: 100 ns, bit line set-up time: 100 ns, charge pump start-up time: 2 $\mu$s, discharge time for the charge pump voltage, etc.: 1 $\mu$s, time for the source voltage to be stabilized: 200 ns, source voltage discharge time: 200 ns, verify time: 2 $\mu$s, and circuit overhead: 1 $\mu$s. The word line set-up time can be ignored in the calculation-because the word line set-up time can overlap the charge pump set-up time. Therefore, the total amount of time required for the entire write operation is about 14 $\mu$s (7 $\mu$s+2 $\mu$s+1 $\mu$s+2 $\mu$s+1 $\mu$s+100 ns+200 ns+200 ns).

(Embodiment 5)

A method and a circuit for writing data to a non-volatile semiconductor memory device according to Embodiment 5 of the present invention will be described.

In Embodiment 4 described above, a voltage (supply voltage) from the outside of the write circuit (voltage source) is used as a desired voltage to be supplied directly to the common source line. On the contrary, in the present embodiment, an externally provided voltage is once increased, and the increased voltage is further regulated so as to stably obtain a desired voltage, which is supplied to the common source line (source). With such a structure, it is possible to address the problem that a sufficient backgate bias may not applied whereby a write operation cannot be performed, which may occur when one employs a value, for example, as low as 1.8 V as the supply voltage V0 in an attempt to reduce the supply voltage.

The principle of operation of the memory cell is basically the same as that described above in Embodiment 4, and thus will not be further described below. The write operation of the present embodiment will now be described.

Figure 15:
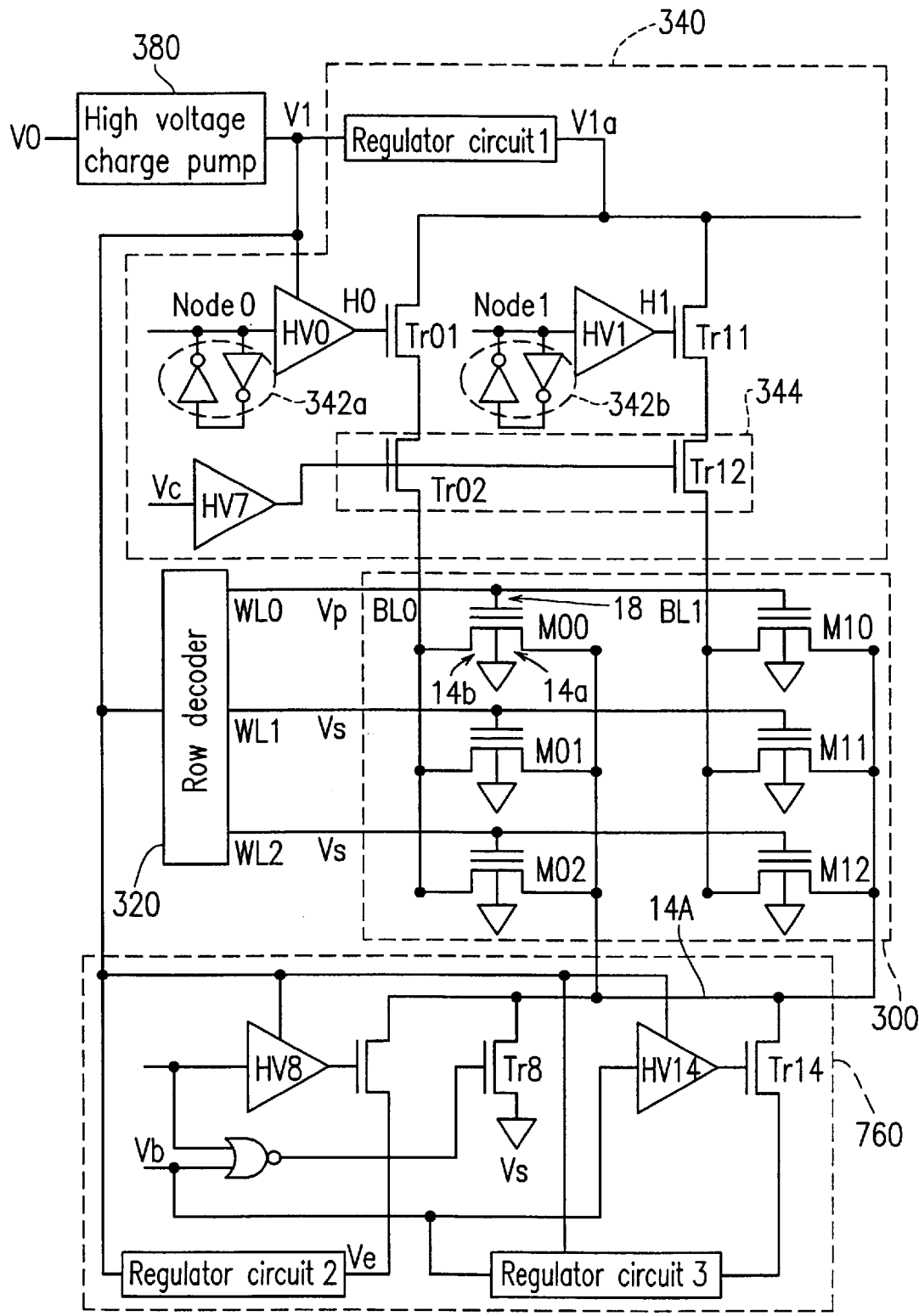
FIG. 15 illustrates the structure of a write circuit of a non-volatile semiconductor memory device according to Embodiment 5 of the present invention.

FIG. 15 illustrates the structure a write circuit of a non-volatile semiconductor memory device according to the present embodiment. The write circuit includes a source voltage application circuit 760 as shown in FIG. 15. In the source voltage application circuit 760, an output voltage V1 (e.g., 8 V) from the high voltage charge pump 380 which increases the supply voltage V0 (e.g., 1.8 V) is regulated by a regulator circuit 3, and the regulated voltage is supplied to the common source line 14A. The regulator circuit 3 has the structure as shown in FIG. 11. When the control signal Vb is at the "high" level (e.g., 1.8 V), the regulator circuit 3 outputs a stable voltage of 3 V, which is the level of V0, for example. When the control signal Vb is at the "low" level (e.g., 0 V), the MOS transistor Tr8 is turned ON, and the source voltage application circuit 760 supplies the reference voltage Vs (e.g., 0 V) to the common source line 14A. The MOS transistor Tr14 and the level shift circuit HV14 in the source voltage application circuit 760 operate in a manner as described above in Embodiment 4. The other elements of the write circuit (the memory cell array 300, the row decoder 320, the program voltage application circuit 340, the high voltage charge pump 380, etc.) are basically the same as those shown in FIG. 10.

The write operation by the write circuit of FIG. 15 will now be described. Consider a case where data "0" (write enabled) and data "1" (write prohibited) are written to the memory cells M00 and M10, respectively, which are connected to the word line WL0, while no data is written to the memory cells M01, M11 and M02, M12, which are connected to the respective word lines WL1 and WL2.

When the write operation is initiated, the high voltage charge pump 380 increases the supply voltage V0 from a voltage source (not shown) so as to output a voltage V1 of 8 V, for example. The voltage V1 is decoded by the row decoder 320 into a voltage Vp of 8 V, for example, and output to the word line WL0. Whereas, the voltage Vs of 0 V, for example, is output from the row decoder 320 to the word lines WL1 and WL2. Each of these voltages are applied to the control gate 18 of the memory cell M which is connected to the respective word line WL, thereby controlling whether or not to perform a write operation to the memory cell M.

The operation of applying a voltage to the drain 14b of the memory cell M via the bit line BL will be described. The voltage V1 from the high voltage charge pump 380 is regulated by the regulator circuit 1 to provide a stable voltage V1a (e.g., 6.5 V). Whether or not the voltage V1a is to be applied to each bit line BL is controlled by the MOS transistors (Tr01 and Tr02 or Tr11 and Tr12) which is connected to the bit line BL. The MOS transistors Tr01 and Tr11 are controlled by data which is externally provided via the node 0 and the node 1, respectively. Whereas the MOS transistors Tr02 and Tr12 together form the column switch 344 and are commonly controlled by the externally provided control signal Vc.

At the initiation of a write operation, the node 0 is brought to the "high" level (e.g., the level of the voltage V0) and the node 1 is brought to the "low" level (e.g., the reference voltage of 0 V) by the externally provided data. The "high" level at the node 0 is latched by the latch circuit 342a and then level-converted by the level shift circuit HV0 into the "high" level which corresponds to the level of the voltage Vp at the node H0. Thus, the MOS transistor Tr01 is turned ON. On the other hand, the "low" level at the node 1 is latched by the latch circuit 342b and then level-converted by the level shift circuit HV1 whose output is still at the "low" level (0 V). Thus, the MOS transistor Tr11 is OFF.

The externally provided control signal Vc at the "high" level (e.g., the level of the voltage V0) is provided to the column switch 344 which is provided in a subsequent stage following the MOS transistors Tr01 and Tr11. The control signal Vc is level-converted by the level shift circuit HV7 into the "high" level which corresponds to the level of the voltage Vp. This signal is input to all of the MOS transistors in the column switch 344, whereby the MOS transistors Tr02 and Tr12 are both turned ON.

Since the MOS transistors Tr01 and Tr02 are ON, the voltage V1a (e.g., 6.5 V) is applied to the memory cell M00 via the bit line BL0. On the other hand, the MOS transistor Tr11 is OFF, and thus the bit line BL1 is floating, whereby there is no voltage application to the memory cell M10.

For the common source line 14A, at the timing when the control signal Vb transitions to the "high" level (e.g., 1.8 V), the regulator circuit 3 regulates the voltage V1 (8 V) which has been generated by the high voltage charge pump 380 so as to output a stable voltage of about 3 V, which is supplied to the common source line 14A. The amount of time for which the voltage is applied to the common source line 14A may be set to be about 500 ns in the case of 64 kB/block. Thus, the potential of the source 14a becomes about 3 V.

Thus, the voltage application as shown in Table 3 is realized, so that a current flows through the memory cell M00, thereby performing a write operation using secondary electrons. In such a case, the current flow per one cell is about 10 $\mu$A. In Embodiments 1 to 3, there is a current flow of about 50 $\mu$A until there is a cell current flow to increase the source voltage so that the backgate bias is applied. In the present embodiment, however, the backgate bias is applied to the source from the beginning, thereby reducing the maximum current which may flow through the memory cell.

After data has been written to the memory cell M00, a program verify operation is performed for verifying the threshold voltage of the memory cell M00. When it is determined that the threshold voltage of the memory cell M00 is equal to or greater than 3.5 V, the write operation is completed. When the threshold voltage of the memory cell M00 is less than 3.5 V, a write operation is repeated by again applying a write signal. Thus, the write and verify operations are performed alternately to each other so that the threshold voltage of the memory cell is controlled to be a predetermined value (equal to or greater than 3.5 V) by verifying the threshold voltage. The erase operation and the read operation are similar to those of Embodiment 1 and thus will not be further described below.

As described above, according to the present embodiment, it is possible to avoid the problem that a sufficient backgate bias may not applied whereby a write operation cannot be performed, which may occur when one employs a low supply voltage in an attempt to reduce the supply voltage.

Moreover, the potential of the common source line 14A is fixed to the desired voltage. As a result, it is possible to avoid the problem which may occur when a resistive element is inserted between the common source line and the reference voltage (i.e., the problem that the voltage of the common source line is varied by the characteristics of the memory cells, and thus the source voltage cannot be determined precisely, whereby it is not possible to stably perform a write operation). In the present embodiment, there is no variation in the source potential which may occur due to differences in a data pattern, whereby it is possible to realize a stable write operation.

According to the present embodiment, the substrate potential (Vs) is 0 V, and it is not necessary to charge the substrate to a negative voltage, whereby it is possible to realize a high-speed write operation. Moreover, it is not necessary to use a negative voltage charge pump whose efficiency is as low as about 10%, so that it is possible to reduce the total layout area by the area which would otherwise be occupied by such a charge pump.

According to the present embodiment, the total write time including overheads, such as the set-up time is less than or equal to 14 $\mu$s. The particulars of the time period are as follows: pulse application time: 7 $\mu$s, word line set-up time: 100 ns, bit line set-up time: 100 ns, charge pump start-up time: 2 $\mu$s, discharge time for the charge pump voltage, etc.: 1 $\mu$s, time for the source voltage to be stabilized: 200 ns, source voltage discharge time: 200 ns, verify time: 2 $\mu$s, and circuit overhead: 1 $\mu$s. The word line set-up time can be ignored in the calculation because the word line set-up time can overlap the charge pump set-up time. Therefore, the total amount of time required for the entire write operation is about 14 $\mu$s (7 $\mu$s+2 $\mu$s+1 $\mu$s+2 $\mu$s+1 $\mu$s+100 ns+200 ns+200 ns).

In Embodiments 1 to 5, the voltage to be applied to the semiconductor base (the substrate 10 or the p-well 12) as the reference voltage Vs is set to be 0 V. Alternatively, this voltage may be a positive voltage. Moreover, in the above description, the potential difference between the source (the common source line) and the semiconductor base is set to be 3 V–0 V=3 V, but the present invention is not limited thereto. Desirable write operation characteristics may be obtained by setting the potential difference to be within the range of about 0.5 V to about 5 V.

The resistive element used in Embodiments 1 to 3 may be any element which includes a resistive component thereby causing a voltage drop when a current flows therethrough. For example, the resistive element may be provided by using a line resistance, a resistance of a diffusion layer, an MOS transistor, or the like.

The number of memory cells included in one block of a memory cell array is not limited to six, as in the above description, and it may of course be set to any other number as necessary.

With the method for writing data to a non-volatile semiconductor memory device of the present invention, the voltages to be applied to different portions of a memory cell are all positive voltages. Therefore, it is possible to save the amount of time which would otherwise be required for negative charging. Thus, the write time is reduced, and it is possible to realize a high-speed write operation. Moreover, the application of a negative voltage to a portion of a memory cell is not performed, so that it is not necessary to provide a negative voltage charge pump whose efficiency is low, and it is possible to reduce the total layout area by the area which would otherwise be occupied by such a charge pump circuit.

Moreover, the supply voltage, as it is, is applied to the common source line. As a result, it is possible to stably supply a desired voltage and to eliminate the need to provide an additional voltage generation circuit in the device for the voltage application to the common source line, thereby reducing the circuit scale.

Moreover, the supply voltage is once increased, and the increased voltage is further regulated so as to stably obtain a desired voltage, which is used as the voltage to be applied to the common source line. As a result, it is possible to address problems which may occur when the supply voltage is reduced to be too low so as to enable a write operation in an attempt to reduce the supply voltage.

Since the present invention employs a write operation using secondary electrons, it is possible to reduce the amount of current to be consumed in the write operation, thereby preventing the booster charge pump circuit from becoming large in scale, as compared to an ordinary write operation using CHEs.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for writing data to a non-volatile semiconductor memory device including a plurality of memory cells which are arranged in a matrix in which data can be electrically written to or erased from the memory cells, the plurality of memory cells being grouped into one or more blocks, the memory cells in each block being provided on a same semiconductor base, each of the memory cells having a field effect transistor including a drain, a source, a floating gate and a control gate, the sources of the memory cells in each block being electrically connected to each other, the method performing a write operation to at least one of the plurality of memory cells in which the method comprises the steps of:

applying a first voltage to the control gate;
applying a second voltage to the drain;
applying a third voltage to the source; and
applying a fourth voltage to the semiconductor base, the fourth voltage having a zero or positive value which is lower than the third voltage, wherein the first voltage, the second voltage, the third voltage and the fourth voltage are different from one other.

2. A method for writing data to a non-volatile semiconductor memory device according to claim 1, wherein:

the write operation is performed by secondary electrons being generated on the drain side of the non-volatile semiconductor memory device and injected into the floating gate;

the first voltage, the second voltage and the third voltage are positive voltages;

the first voltage is higher than the second voltage; and the second voltage is higher than the third voltage.

3. A method for writing data to a non-volatile semiconductor memory device according to claim 1, wherein the third voltage is equal to a supply voltage output from a voltage source provided for supplying a voltage to the memory cells.

4. A method for writing data to a non-volatile semiconductor memory device according to claim 1, wherein the third voltage is higher than a supply voltage output from a voltage source provided for supplying a voltage to the memory cells.

5. A method for writing data to a non-volatile semiconductor memory device according to claim 4, wherein the third voltage is obtained by generating a fifth voltage higher than the supply voltage from the voltage source by using a charge pump circuit and by regulating the fifth voltage so as to decrease a level of the fifth voltage.

6. A circuit for writing data to a non-volatile semiconductor memory device including a plurality of memory cells which are arranged in a matrix in which data can be electrically written to or erased from the memory cells, the plurality of memory cells being grouped into one or more blocks, the memory cells in each block being provided on a same semiconductor base, each of the memory cells having a field effect transistor including a drain, a source, a floating gate and a control gate, the sources of the memory cells in each block being electrically connected to each other, wherein a voltage path is provided between the source and the semiconductor base, the voltage path including an element capable of causing a voltage drop.

7. A circuit for writing data to a non-volatile semiconductor memory device according to claim 6, wherein a plurality of the voltage paths are provided in parallel, the number of the voltage paths being equal to the number of columns of the memory cells matrix.

8. A circuit for writing data to a non-volatile semiconductor memory device according to claim 6, wherein the element capable of causing a voltage drop is a resistive element.

9. A circuit for writing data to a non-volatile semiconductor memory device according to claim 6, wherein the voltage path is in an ON state only during a write operation, and a voltage is supplied to the source from an external circuit during a period of time other than the write operation.

10. A circuit for writing data to a non-volatile semiconductor memory device according to claim 6, further comprising a control circuit for ensuring that during a write operation, in each block, a number of columns of the memory cells matrix to which data is simultaneously written and a number of voltage paths which are simultaneously in an ON state.

11. A circuit for writing data to a non-volatile semiconductor memory device according to claim 6, wherein during a write operation, a current which flows through the field effect transistor flows through the voltage path so that a voltage of the commonly connected sources is higher than a potential of the semiconductor base.

* * * * *